(12) United States Patent
Imai et al.

(10) Patent No.: US 10,700,406 B2
(45) Date of Patent: Jun. 30, 2020

(54) WIRELESS MODULE AND IMAGE DISPLAY DEVICE

(71) Applicant: Panasonic Intellectual Property Management Co., Ltd., Osaka (JP)

(72) Inventors: Kazuhiro Imai, Osaka (JP); Hitoshi Takai, Osaka (JP); Masashi Koshi, Ishikawa (JP); Hiroyuki Uno, Ishikawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/767,739

(22) PCT Filed: Dec. 6, 2016

(86) PCT No.: PCT/JP2016/005063
§ 371 (c)(1),
(2) Date: Apr. 12, 2018

(87) PCT Pub. No.: WO2017/098719
PCT Pub. Date: Jun. 15, 2017

(65) Prior Publication Data
US 2018/0301799 A1    Oct. 18, 2018

(30) Foreign Application Priority Data

Dec. 10, 2015  (JP) ................................. 2015-241592

(51) Int. Cl.
*H01Q 1/48*   (2006.01)
*H01Q 1/02*   (2006.01)
(Continued)

(52) U.S. Cl.
CPC ................. *H01Q 1/02* (2013.01); *H01Q 1/24* (2013.01); *H01Q 1/48* (2013.01); *H01Q 9/0421* (2013.01);
(Continued)

(58) Field of Classification Search
CPC ............ H01Q 1/02; H01Q 1/243; H01Q 1/48; H01Q 9/0421; H01Q 1/526
See application file for complete search history.

(56) References Cited

U.S. PATENT DOCUMENTS

| 9,147,633 B2 | 9/2015 | Eid et al. |
| 2006/0214849 A1* | 9/2006 | Fabrega-Sanchez ....................... G02B 27/62 343/700 MS |

(Continued)

FOREIGN PATENT DOCUMENTS

| JP | 2002-344172 | 11/2002 |
| JP | 2003-234616 | 8/2003 |

(Continued)

OTHER PUBLICATIONS

International Search Report of PCT application No. PCT/JP2016/005063 dated Jan. 10, 2017.

(Continued)

*Primary Examiner* — Ab Salam Alkassim, Jr.
(74) *Attorney, Agent, or Firm* — McDermott Will & Emery LLP

(57) ABSTRACT

A wireless module includes: a substrate; a ground pattern formed on the substrate; a heat generating component mounted on the substrate and connected to the ground pattern; a pattern antenna including a grounding part connected to the ground pattern and a power feeding part fed with power from the heat generating component, the pattern antenna being formed on the substrate; and a conductive (Continued)

base plate electrically connected to the ground pattern and disposed opposite to the pattern antenna.

11 Claims, 18 Drawing Sheets

(51) Int. Cl.
    *H01Q 1/24*     (2006.01)
    *H01Q 9/04*     (2006.01)
    *H05K 3/00*     (2006.01)
    *H01Q 1/44*     (2006.01)
    *H01Q 1/52*     (2006.01)

(52) U.S. Cl.
    CPC ............... *H01Q 1/44* (2013.01); *H01Q 1/526* (2013.01); *H05K 3/0061* (2013.01)

(56) References Cited

U.S. PATENT DOCUMENTS

| | | | | |
|---|---|---|---|---|
| 2007/0205945 A1* | 9/2007 | Tatarnikov | ............... | H01Q 1/38 343/700 MS |
| 2013/0090152 A1* | 4/2013 | Yamazaki | ............. | H04M 1/026 455/575.7 |
| 2013/0241792 A1* | 9/2013 | Ishikawa | .................. | H01Q 1/38 343/848 |
| 2014/0091983 A1 | 4/2014 | Nakano et al. | | |
| 2014/0247556 A1* | 9/2014 | Eid | ..................... | H01L 23/3675 361/700 |
| 2015/0311579 A1* | 10/2015 | Irci | ........................ | H01Q 1/243 343/702 |
| 2019/0089046 A1* | 3/2019 | Koshi | ...................... | H01Q 5/30 |

FOREIGN PATENT DOCUMENTS

| | | |
|---|---|---|
| JP | 2004-172912 | 6/2004 |
| JP | 2008-124865 | 5/2008 |
| JP | 2013-526802 | 6/2013 |
| JP | 2014-072363 | 4/2014 |
| WO | 2011/143505 | 11/2011 |

OTHER PUBLICATIONS

Communication pursuant to Rule 164(1) EPC dated Oct. 25, 2018 for the related European Patent Application No. 16872621.4.
The Extended European Search Report dated Mar. 10, 2020 for the related European Patent Application No. 16872621.4.

* cited by examiner

WIRELESS MODULE AND IMAGE DISPLAY DEVICE

This application is a U.S. national stage application of the PCT International Application No. PCT/JP2016/005063 filed on Dec. 6, 2016, which claims the benefit of foreign priority of Japanese patent application No. 2015-241592 filed on Dec. 10, 2015, the contents all of which are incorporated herein by reference.

TECHNICAL FIELD

The present disclosure relates to a wireless module including an antenna, and to an image display device including the wireless module.

BACKGROUND ART

PTL 1 discloses an antenna device including: a circuit board having a power amplifier; and a planar inverted F antenna (PIFA). In the antenna device disclosed in PTL 1, the PIFA antenna includes: an antenna body; two attachment surfaces which are a surface to be attached to a ground plane of the circuit board and a surface to be connected to an output terminal of the power amplifier; and an attachment foot part that connects the two attachment surfaces and the antenna body to each other. The antenna body of the PIFA antenna is disposed opposite to the ground plane of the circuit board. In the antenna device disclosed in PTL 1, heat generated in the power amplifier that is a heat generating component is conducted to the antenna body via the attachment foot part, and is thereby radiated.

CITATION LIST

Patent Literature

PTL 1: Japanese Translation of PCT Publication No. 2013-526802

SUMMARY

The present disclosure provides a wireless module including an antenna and a heat generating component, the wireless module being capable of enhancing heat radiation characteristics, and an image display device including the wireless module.

The wireless module in the present disclosure includes: a substrate; a ground pattern formed on the substrate; a heat generating component mounted on the substrate and connected to the ground pattern; a pattern antenna including a grounding part connected to the ground pattern and a power feeding part fed with power from the heat generating component, the pattern antenna being formed on the substrate; and a base plate electrically connected to the ground pattern and disposed opposite to the pattern antenna.

The wireless module in the present disclosure is effective for enhancing the heat radiation characteristics.

DESCRIPTION OF EMBODIMENTS

Figure 1A:
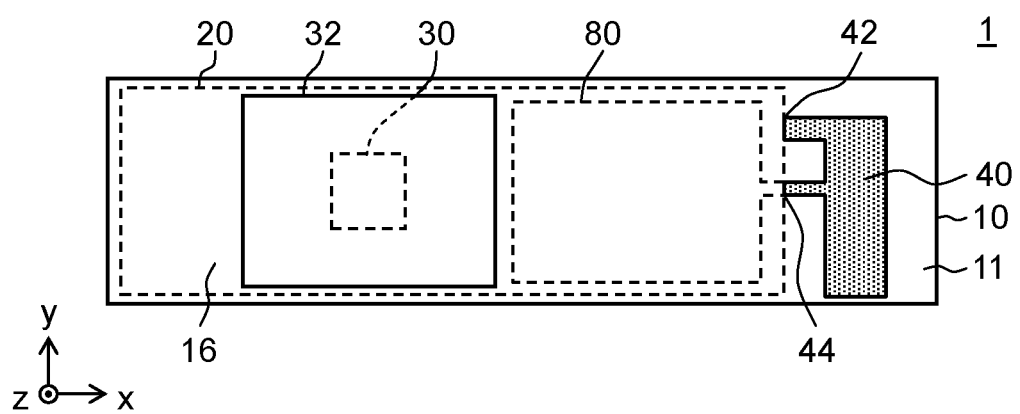
FIG. 1A is a top view schematically showing an example of an external appearance of a wireless module in a first exemplary embodiment.

Hereinafter, exemplary embodiments will be described in detail with reference to the drawings as appropriate. It is to be noted, however, that detailed descriptions which are more than necessary may be omitted. For example, a detailed description of a matter which has been already well-known, or an overlapped description of substantially the same configuration may be omitted. This is intended to avoid the following description from becoming unnecessarily redundant and to facilitate understanding of those skilled in the art.

Note that the attached drawings and the following description are provided for those skilled in the art to fully understand the present disclosure, and are not intended to limit the subject matter as described in the appended claims.

The drawings are also schematic views, and are not always exactly illustrated. In the drawings, substantially the same constituent elements are denoted by the same reference numerals, and a description thereof is omitted or simplified as appropriate.

First Exemplary Embodiment

Hereinafter, a wireless module according to a first exemplary embodiment will be described with reference to FIGS. 1 to 4G.

[1-1. Configuration]

First, a configuration of wireless module 1 in this exemplary embodiment will be described with reference to the drawings.

FIG. 1A is a top view schematically showing an example of an external appearance of wireless module 1 in a first exemplary embodiment.

Figure 1B:
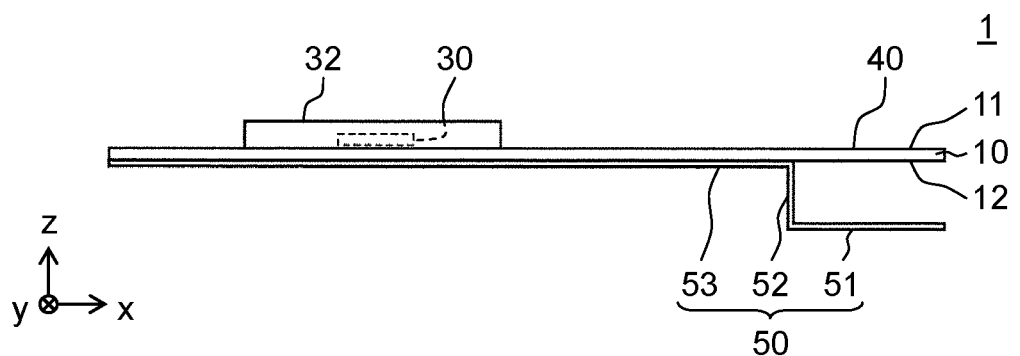
FIG. 1B is a side view schematically showing the example of the external appearance of the wireless module in the first exemplary embodiment.

FIG. 1B is a side view schematically showing the example of the external appearance of wireless module 1 in the first exemplary embodiment.

Figure 2:
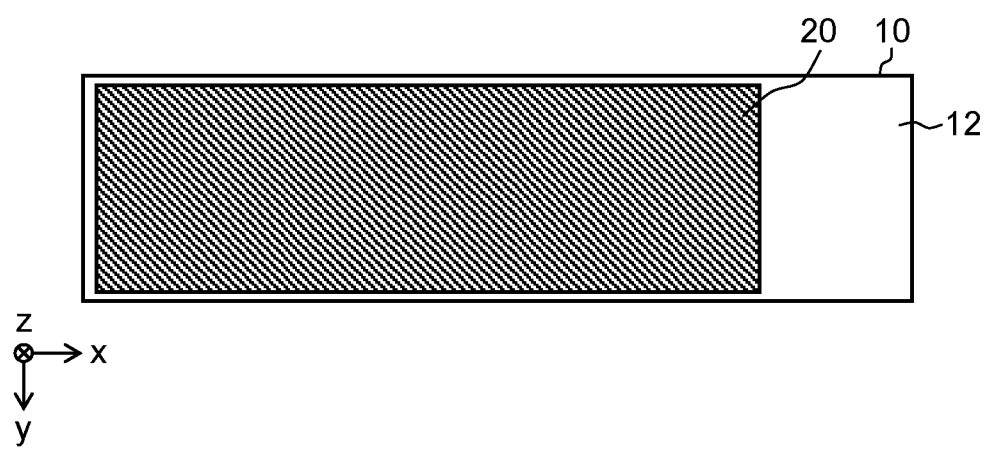
FIG. 2 is a bottom view schematically showing an example of an external appearance of a substrate of the wireless module in the first exemplary embodiment.

FIG. 2 is a bottom view schematically showing an example of an external appearance of substrate 10 of wireless module 1 in the first exemplary embodiment.

Figure 3:
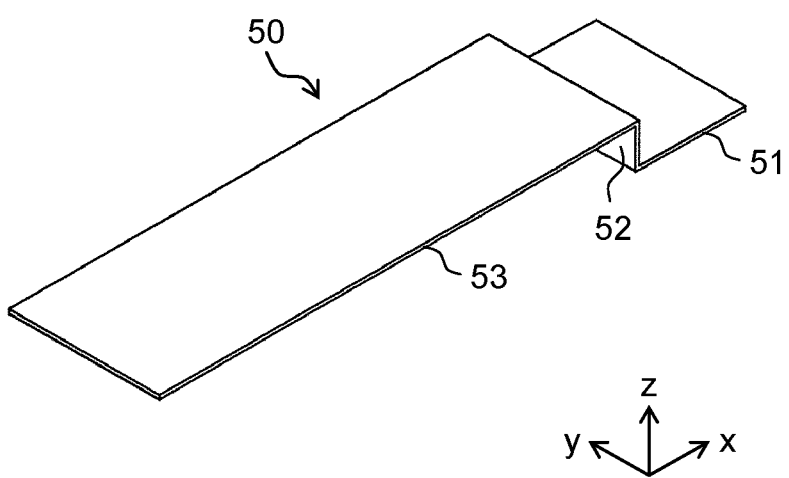
FIG. 3 is a perspective view schematically showing an example of an external appearance of a base plate of the wireless module in the first exemplary embodiment.

FIG. 3 is a perspective view schematically showing an example of an external appearance of plate-shaped member (hereinafter, referred to as "base plate") 50 of wireless module 1 in the first exemplary embodiment.

Note that, in the drawings used in the following description, three axes, i.e., an x-axis, a y-axis, and a z-axis are shown. An axis in a longitudinal direction of wireless module 1 is defined as the x-axis. An axis perpendicular to an x-axis direction and perpendicular to a main surface of substrate 10 of wireless module 1 is defined as a z-axis. An axis orthogonal to both the x-axis and the z-axis is defined as the y-axis. However, these axes are shown only for convenience, and do not limit the present disclosure in any way.

Wireless module 1 according to this exemplary embodiment is a wireless terminal that transmits and receives electromagnetic wave signals. For example, wireless module 1 is a wireless terminal based on a standard such as a wireless LAN (Local Area Network) and Bluetooth (registered trademark). As shown in FIG. 1A, wireless module 1 includes substrate 10, ground patterns 20, heat generating component 30, and pattern antenna 40. In this exemplary embodiment, wireless module 1 further includes matching circuit 80. Moreover, as shown in FIG. 1B, wireless module 1 includes base plate 50. A description of base plate 50 will be made later.

As shown in FIG. 1A, substrate 10 is a circuit board on which ground patterns 20 and pattern antenna 40 are formed and on which heat generating component 30 is mounted. In this exemplary embodiment, substrate 10 is a rectangular plate-shaped dielectric. Substrate 10 is, for example, a glass epoxy substrate. As shown in FIG. 1B, substrate 10 has first main surface 11 on which the antenna is formed, and second main surface 12 opposite to first main surface 11.

As shown in FIGS. 1A and 2, ground patterns 20 are wiring patterns formed on substrate 10. Ground patterns 20 are formed on a first main surface 11 side and a second main surface 12 side of substrate 10, and respective ground patterns 20 are electrically connected to each other via a sufficient number of via electrodes (not shown) or the like. Ground patterns 20 are formed, for example, of metal foil such as copper foil. As shown in FIG. 1A, ground pattern 20 formed on the first main surface 11 side is covered with resist 16. Resist 16 is an insulating film that protects the wiring pattern formed on substrate 10. In this exemplary embodiment, an entire surface or a part of ground pattern 20 formed on the second main surface 12 side is not covered with resist 16 and exposed to an outside. Note that, although FIG. 2 shows a configuration example in which the entire surface of ground pattern 20 formed on the second main surface 12 side is exposed to the outside without being covered with resist 16, a part of ground pattern 20 may be covered with resist 16. As shown in FIG. 1B, base plate 50 shown in FIG. 3 is connected to ground pattern 20 formed on the second main surface 12 side shown in FIG. 2. Then, in wireless module 1, a ground plane is formed of ground patterns 20 and base plate 50.

Heat generating component 30 is a circuit component, which is mounted on substrate 10 and connected to ground patterns 20. In this exemplary embodiment, heat generating component 30 is a component including a power amplifier or the like, and for example, is a wireless LAN chip. A high-frequency signal amplified by the power amplifier included in heat generating component 30 is supplied to pattern antenna 40.

In this exemplary embodiment, as shown in FIG. 1A, heat generating component 30 is covered with shield case 32. Shield case 32 is a metal box-shaped conductive member that covers heat generating component 30 mounted on first main surface 11 of substrate 10. Shield case 32 suppresses entry of electromagnetic noise from an outside of shield case 32 to an inside of shield case 32, and also suppresses leakage of electromagnetic noise, which is generated in the inside of shield case 32, to the outside of shield case 32. In this exemplary embodiment, shield case 32 is connected to ground pattern 20 by soldering or the like. In this way, an electromagnetic noise shielding effect by shield case 32 is enhanced. Note that shield case 32 may cover not only heat generating component 30 but also other circuit elements.

As shown in FIG. 1A, pattern antenna 40 is an antenna element, which is formed on substrate 10, and includes: grounding part 42 connected to ground patterns 20; and power feeding part 44 fed with power from heat generating component 30. Pattern antenna 40 is formed, for example, of metal foil such as copper foil. In this exemplary embodiment, pattern antenna 40 is a PIFA, and operates as an antenna by being combined with base plate 50. However, a pattern shape of pattern antenna 40 is not limited to this. For example, pattern antenna 40 may be a multi-band adaptable antenna adaptable for multi bands.

Grounding part 42 of pattern antenna 40 is a grounding point connected to ground patterns 20. Ground pattern 20 on the first main surface 11 side and ground pattern 20 on the second main surface 12 side are electrically connected to each other via the via electrodes or the like as close as possible to grounding part 42. For example, it is preferable that a distance from grounding part 42 to the via electrodes is set to approximately $1/20$ times or less a wavelength of an electromagnetic wave used in wireless module 1. Pattern antenna 40 may be formed integrally with ground patterns 20, or may be connected to ground patterns 20 by soldering or the like.

Power feeding part 44 of pattern antenna 40 is a portion including a feeding point fed with power from heat generating component 30. The high-frequency signal output from heat generating component 30 is supplied to power feeding part 44 via matching circuit 80. Pattern antenna 40 may be formed integrally with a wiring pattern that configures matching circuit 80, or may be connected to the wiring pattern by soldering or the like.

Matching circuit 80 is an impedance matching circuit for suppressing reflection of the high-frequency signal, which is output from heat generating component 30, the reflection being caused at pattern antenna 40. The high-frequency signal output from heat generating component 30 is input to matching circuit 80. Moreover, matching circuit 80 outputs the high-frequency signal to power feeding part 44 of pattern antenna 40. In this exemplary embodiment, on the first main surface 11 side of substrate 10, matching circuit 80 is disposed between heat generating component 30 and pattern antenna 40.

Base plate 50 is a conductive plate-shaped member, which is electrically connected to ground pattern 20 and is disposed opposite to pattern antenna 40. In ground pattern 20 formed on the second main surface 12 side, such a portion connected to base plate 50 without being covered with resist 16 includes a rear side of grounding part 42, or the via electrodes disposed as close as possible to grounding part 42. Base plate 50 functions as an antenna together with pattern antenna 40, and further, base plate 50 also functions as a heat radiating member that radiates heat generated by heat generating component 30. In this exemplary embodiment, as shown in FIG. 3, base plate 50 has a shape bent in a crank shape, and includes opposed portion 51, a gap forming portion 52, and a conducting portion 53. Base plate 50 is formed, for example, of a metal material such as aluminum, iron, and alloys of a variety of metals.

Opposed portion 51 of base plate 50 is a portion disposed opposite to pattern antenna 40. In this exemplary embodiment, opposed portion 51 has a substantially flat plate shape, and is disposed apart from pattern antenna 40 and substrate 10. That is, a gap is formed between opposed portion 51 and pattern antenna 40. A distance between opposed portion 51 and pattern antenna 40 is, for example, approximately $1/30$ to $1/10$ times the wavelength of the electromagnetic wave used in wireless module 1.

Gap forming portion 52 of base plate 50 is disposed between opposed portion 51 and the conducting portion 53, and is a plate-shaped portion connecting the opposed portion 51 and the conducting portion 53. Gap forming portion 52 is disposed in a plane that intersects substrate 10, thereby forming a gap between opposed portion 51 and pattern antenna 40. In this exemplary embodiment, gap forming portion 52 is disposed in a plane substantially orthogonal to substrate 10.

Conducting portion 53 of base plate 50 is a plate-shaped portion electrically connected to ground pattern 20. In this exemplary embodiment, conducting portion 53 is connected to ground pattern 20 on the second main surface 12 side of substrate 10 shown in FIG. 2 by using a fastening member. The fastening member is a member that fastens base plate 50 and substrate 10 to each other. In this exemplary embodiment, for example, a conductive adhesive is used as the fastening member. In this way, conducting portion 53, that is, base plate 50 is electrically connected to ground patterns 20. Moreover, the heat generated in heat generating component 30 is conducted to conducting portion 53 via the conductive adhesive. In this exemplary embodiment, a member having a high thermal conductivity is preferable as the conductive adhesive. In this way, in wireless module 1, the heat conducted to conducting portion 53 is efficiently conducted to the entire base plate 50, and is radiated from the base plate 50 to ambient air.

[1-2. Comparison with Conventional Technique]

Here, wireless module 1 according to this exemplary embodiment will be described in comparison with the conventional antenna device disclosed in PTL 1 mentioned above.

The antenna device disclosed in PTL 1 is configured by an antenna body disposed opposite to a ground plane of a circuit board. In the antenna device, heat is radiated by an antenna body via an attachment foot part. Here, dimensions and shape of the antenna body are defined by a frequency of an electromagnetic wave used in the antenna device. As the frequency of the electromagnetic wave used in the antenna device is higher, the wavelength becomes shorter, and the dimensions of the antenna body become smaller. Therefore, particularly in an antenna device using a relatively high frequency band, since the antenna body becomes relatively small, sufficient heat radiation characteristics may not be obtained in some cases.

Meanwhile, in wireless module 1 according to this exemplary embodiment, the antenna body corresponds to pattern antenna 40, and base plate 50 corresponding to the ground plane functions as the heat radiating member of heat generating component 30. Dimensions and shape of base plate 50 are not limited by the frequency and wavelength of the electromagnetic wave used in wireless module 1, and have a large degree of freedom in design. Therefore, in wireless module 1, dimensions and shape of base plate 50, which are sufficiently large according to required heat radiation characteristics, can be determined in designing. Hence, in wireless module 1, heat radiation characteristics sufficient for dissipating the heat generated by heat generating component 30 can be realized by base plate 50.

Moreover, in the antenna device disclosed in PTL 1, since the heat generated by the heat generating component is radiated by the antenna body via the attachment foot part, it is necessary to dispose the heat generating component in proximity to the attachment foot part of the antenna body.

Meanwhile, in wireless module 1 according to this exemplary embodiment, the heat generated from heat generating component 30 is dissipated by base plate 50 that has high thermal conductivity and can be freely designed so as to be suitable for heat radiation. Therefore, heat generating component 30 can be disposed at an arbitrary position where the heat can be conducted to base plate 50. As described above, in wireless module 1 according to this exemplary embodiment, a degree of freedom in the disposed position of heat generating component 30 is high. In particular, when heat generating component 30 is a wireless LAN chip with which a power amplifier is integrated, there may be cases where it is difficult to dispose heat generating component 30 in proximity to pattern antenna 40. Therefore, in designing wireless module 1, it is advantageous that the degree of freedom in the disposed position of heat generating component 30 is high as in wireless module 1 according to this exemplary embodiment.

[1-3. Effects and Others]

As described above, in this exemplary embodiment, a wireless module includes: a substrate; a ground pattern formed on the substrate; a heat generating component mounted on the substrate and connected to the ground pattern; a pattern antenna including a grounding part connected to the ground pattern and a power feeding part fed with power from the heat generating component, the pattern antenna being formed on the substrate; and a conductive base plate electrically connected to the ground pattern and disposed opposite to the pattern antenna.

Note that wireless module 1 is an example of the wireless module. Substrate 10 is an example of the substrate. Each of ground patterns 20 is an example of the ground pattern. Heat generating component 30 is an example of the heat generating component. Grounding part 42 is an example of the grounding part. Power feeding part 44 is an example of the power feeding part. Pattern antenna 40 is an example of the pattern antenna. Base plate 50 is an example of the base plate.

For example, in the example shown in the first exemplary embodiment, wireless module 1 includes: substrate 10; ground patterns 20 formed on substrate 10; and heat generating component 30 mounted on substrate 10 and connected to ground patterns 20. Moreover, wireless module 1 further includes: pattern antenna 40, which is formed on substrate 10, and includes: grounding part 42 connected to ground patterns 20; and power feeding part 44 fed with power from heat generating component 30. Furthermore, wireless module 1 further includes conductive base plate 50, which is electrically connected to ground patterns 20 and is disposed opposite to pattern antenna 40.

Since wireless module 1 configured as described above includes base plate 50 connected to heat generating component 30 via ground pattern 20, the heat generated by heat generating component 30 can be dissipated by base plate 50. The dimensions and shape of base plate 50 are not limited by the frequency and wavelength of the electromagnetic wave used in wireless module 1. Therefore, it is possible to design base plate 50 with dimensions and a shape, which correspond to the heat radiation characteristics required for wireless module 1. In this way, sufficient heat radiation characteristics can be realized in wireless module 1.

The wireless module may further include a fastening member that fastens the substrate and the base plate to each other.

Note that the conductive adhesive is an example of the fastening member.

For example, in the example shown in the first exemplary embodiment, wireless module 1 further includes the fastening member (conductive adhesive) that fastens substrate 10 and base plate 50 to each other.

In this way, in wireless module 1, base plate 50 can be stably fixed to substrate 10.

In the wireless module, the fastening member may have conductivity, and may be in contact with the ground pattern. The base plate may be electrically connected to the ground pattern via the fastening member.

For example, in the example shown in the first exemplary embodiment, in wireless module 1, the fastening member (conductive adhesive) has conductivity, and is in contact with ground patterns 20. Moreover, base plate 50 is electrically connected to ground patterns 20 via the fastening member (conductive adhesive).

In this way, in wireless module 1, base plate 50 can be electrically connected to ground patterns 20 via the conductive fastening member made of the conductive adhesive or the like. In this way, in wireless module 1, an antenna unit including base plate 50 and pattern antenna 40 can be formed.

The wireless module may further include a heat conducting member, which is disposed between the base plate and the heat generating component, and conducts, to the base plate, heat generated by the heat generating component.

Note that the conductive adhesive is an example of the heat conducting member.

For example, in the example shown in the first exemplary embodiment, wireless module 1 further includes the heat conducting member (conductive adhesive), which is disposed between base plate 50 and heat generating component 30, and conducts, to base plate 50, the heat generated by heat generating component 30.

In this way, in wireless module 1, since heat is efficiently conducted from heat generating component 30 to base plate 50, the heat generated by heat generating component 30 can be efficiently radiated in base plate 50.

[1-4. Modification Examples]

Subsequently, modification examples of wireless module 1 according to this exemplary embodiment will be described.

In wireless module 1 according to this exemplary embodiment, the shape of base plate 50 is not limited to such a shape as shown in FIG. 3. Hereinafter, as modification examples of this exemplary embodiment, wireless modules including base plates having shapes different from that of base plate 50 will be described with reference to the drawings. Note that, in the following description, constituent elements substantially the same as constituent elements included in wireless module 1 described in the first exemplary embodiment are denoted by the same reference numerals, and a description thereof is omitted.

Figure 4A:
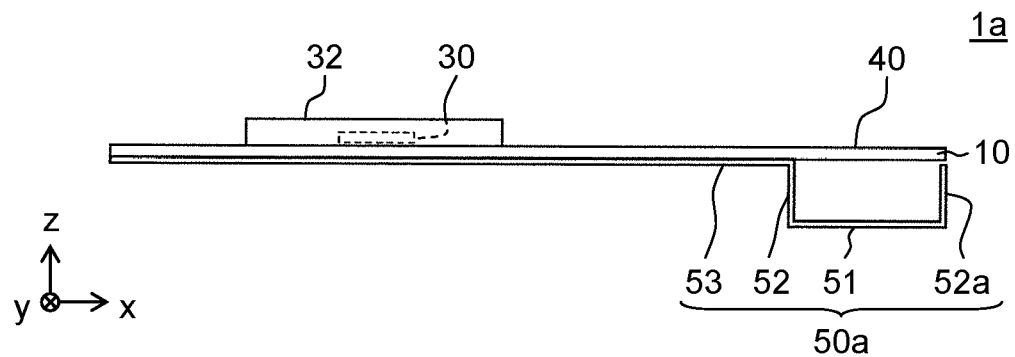
FIG. 4A is a side view schematically showing an example of an external appearance of a wireless module in a first modification example of the first exemplary embodiment.

FIG. 4A is a side view schematically showing an example of an external appearance of wireless module 1a in a first modification example of the first exemplary embodiment.

Figure 4B:
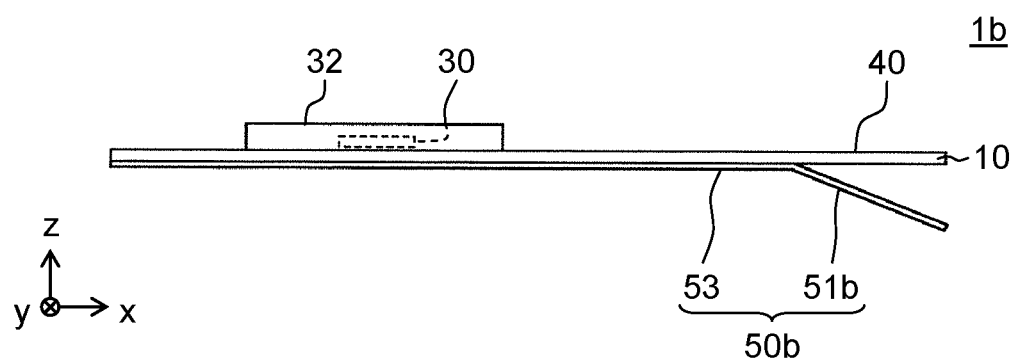
FIG. 4B is a side view schematically showing an example of an external appearance of a wireless module in a second modification example of the first exemplary embodiment.

FIG. 4B is a side view schematically showing an example of an external appearance of wireless module 1b in a second modification example of the first exemplary embodiment.

Figure 4C:
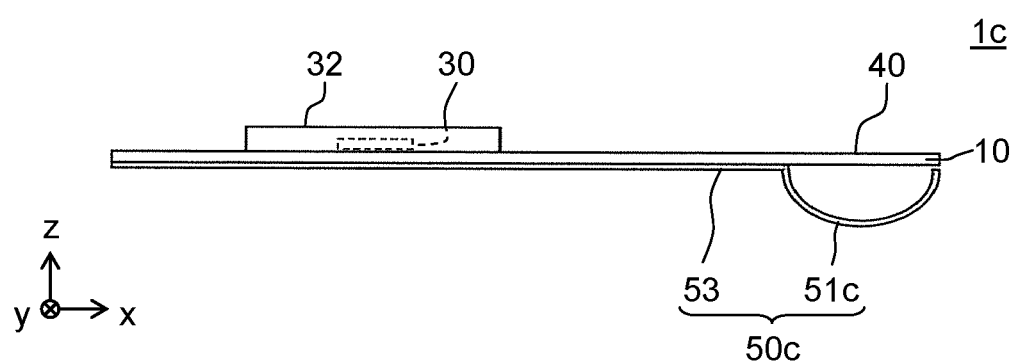
FIG. 4C is a side view schematically showing an example of an external appearance of a wireless module in a third modification example of the first exemplary embodiment.

FIG. 4C is a side view schematically showing an example of an external appearance of wireless module 1c in a third modification example of the first exemplary embodiment.

Figure 4D:
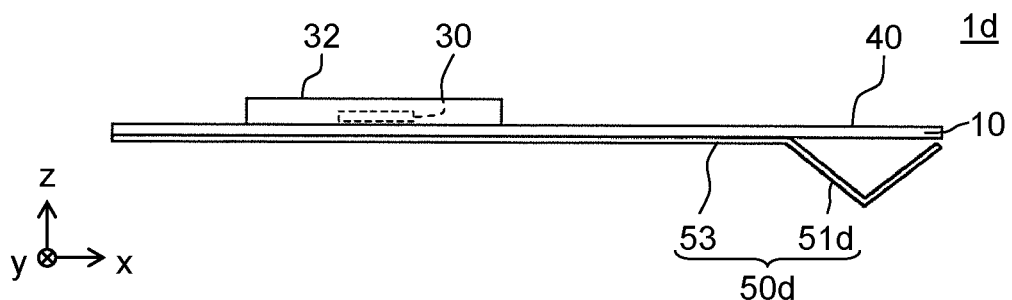
FIG. 4D is a side view schematically showing an example of an external appearance of a wireless module in a fourth modification example of the first exemplary embodiment.

FIG. 4D is a side view schematically showing an example of an external appearance of wireless module 1d in a fourth modification example of the first exemplary embodiment.

Figure 4E:
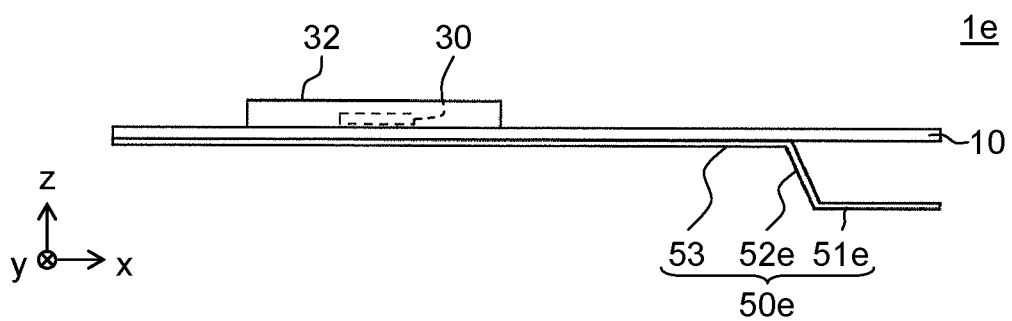
FIG. 4E is a side view schematically showing an example of an external appearance of a wireless module in a fifth modification example of the first exemplary embodiment.

FIG. 4E is a side view schematically showing an example of an external appearance of wireless module 1e in a fifth modification example of the first exemplary embodiment.

Figure 4F:
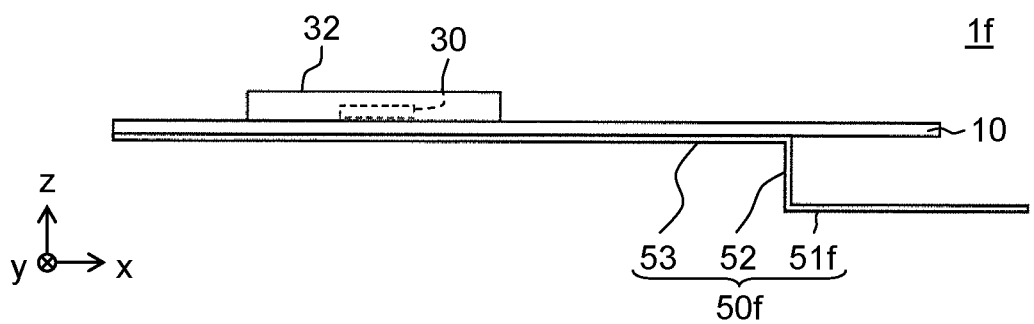
FIG. 4F is a side view schematically showing an example of an external appearance of a wireless module in a sixth modification example of the first exemplary embodiment.

FIG. 4F is a side view schematically showing an example of an external appearance of wireless module 1f in a sixth modification example of the first exemplary embodiment.

Figure 4G:
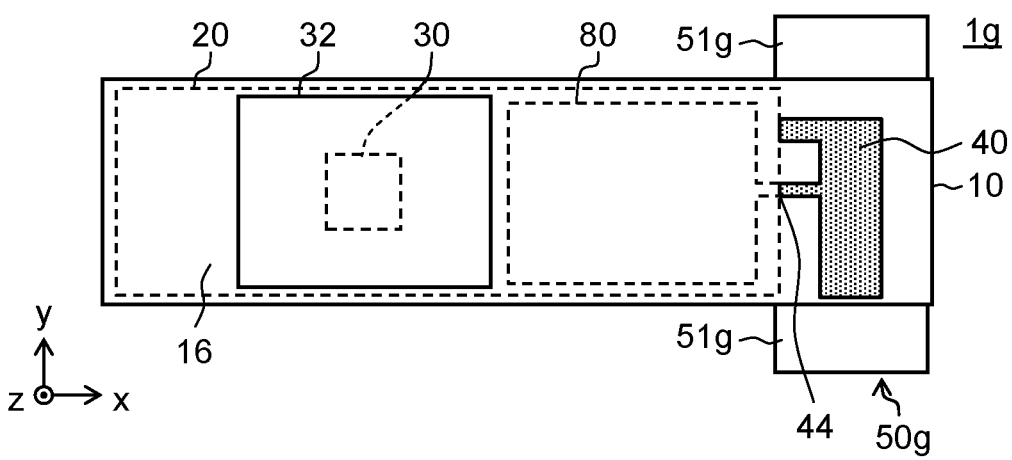
FIG. 4G is a top view schematically showing an example of an external appearance of a wireless module in a seventh modification example of the first exemplary embodiment.

FIG. 4G is a top view schematically showing an example of an external appearance of wireless module 1g in a seventh modification example of the first exemplary embodiment.

In wireless module 1a according to the first modification example of the first exemplary embodiment, as shown in FIG. 4A, base plate 50a includes a substantially flat plate-shaped closed portion 52a, which is opposed to gap forming portion 52, at an end of opposed portion 51 (that is, an end on a side opposed to an end provided with gap forming portion 52). Also in wireless module 1a including such a closed portion 52a, similar effects to those of wireless module 1 according to this exemplary embodiment are exerted.

In wireless module 1b according to the second modification example of the first exemplary embodiment, as shown in FIG. 4B, base plate 50b does not include gap forming portion 52. Base plate 50b includes opposed portion 51b, which is directly connected to conducting portion 53, and is provided so as to be inclined with respect to substrate 10 and pattern antenna 40 when base plate 50b is viewed from the side (y-axis direction). As described above, also in wireless module 1b including opposed portion 51b provided so as to be inclined with respect to pattern antenna 40, similar effects to those of wireless module 1 according to this exemplary embodiment are exerted.

In wireless module 1c according to the third modification example of the first exemplary embodiment, as shown in FIG. 4C, base plate 50c does not include gap forming portion 52. Base plate 50c includes opposed portion 51c, which is directly connected to conducting portion 53, and has a substantially semicylindrical cross section when base plate 50c is viewed from the side (y-axis direction). As described above, also in wireless module 1c including opposed portion 51c having such a substantially semicylindrical cross section, similar effects to those of wireless module 1 according to this exemplary embodiment are exerted.

In wireless module 1d according to the fourth modification example of the first exemplary embodiment, as shown in FIG. 4D, base plate 50d does not include gap forming portion 52. Base plate 50d includes opposed portion 51d, which is directly connected to conducting portion 53, and has a substantially V-shaped cross section when base plate 50c is viewed from the side (y-axis direction). Also in wireless module 1d including opposed portion 51d having such a shape, similar effects to those of wireless module 1 according to this exemplary embodiment are exerted.

In wireless module 1e according to the fifth modification example of the first exemplary embodiment, as shown in FIG. 4E, base plate 50e includes: a substantially flat plate-shaped opposed portion 51e provided substantially in parallel to pattern antenna 40 when base plate 50e is viewed from the side (y axis direction); and substantially flat plate-shaped gap forming portion 52e provided so as to be inclined with respect to opposed portion 51e when base plate 50e is viewed from the side (y-axis direction). As described above, also in wireless module 1e including gap forming portion 52e provided so as to be inclined with respect to opposed portion 51e, similar effects to those of wireless module 1 according to this exemplary embodiment are exerted.

In wireless module 1f according to the sixth modification example of the first embodiment, as shown in FIG. 4F, base plate 50f includes opposed portion 51f whose length in the x-axis direction in FIG. 4F is longer than a length of opposed portion 51 according to the first exemplary embodiment. In this modification example, as shown in FIG. 4F, opposed portion 51f protrudes from substrate 10 in an x-axis positive direction. Also in wireless module 1f including such an opposed portion 51f, similar effects to those of wireless module 1 according to this exemplary embodiment are exerted.

In wireless module 1g according to the seventh modification example of the first embodiment, as shown in FIG. 4G, base plate 50g includes opposed portion 51g whose length in the y-axis direction in FIG. 4G is longer than a length of opposed portion 51 according to the first exemplary embodiment. In this modification example, as shown in FIG. 4G, opposed portion 51g protrudes from substrate 10 individually in a y-axis positive direction and a y-axis negative direction. Also in wireless module 1g including such opposed portion 51g, similar effects to those of wireless module 1 according to this exemplary embodiment are exerted.

Second Exemplary Embodiment

Next, wireless module 101 according to a second exemplary embodiment will be described. Wireless module 101 according to this exemplary embodiment has substantially the same configuration as wireless module 1 described in the first exemplary embodiment. However, wireless module 101 described in the second exemplary embodiment is different from wireless module 1 according to the first exemplary embodiment in the connection configuration of the base plate and the ground pattern.

Hereinafter, with regard to wireless module 101 according to this exemplary embodiment, a description of the matters described in the first exemplary embodiment will be omitted as appropriate, and points of difference from wireless module 1 according to the first exemplary embodiment will be mainly described. Note that, constituent elements substantially the same as the constituent elements included in wireless module 1 described in the first exemplary embodiment are denoted by the same reference numerals, and a description thereof is omitted or simplified.

[2-1. Configuration]

First, a configuration of wireless module 101 in this exemplary embodiment will be described with reference to the drawings.

Figure 5A:
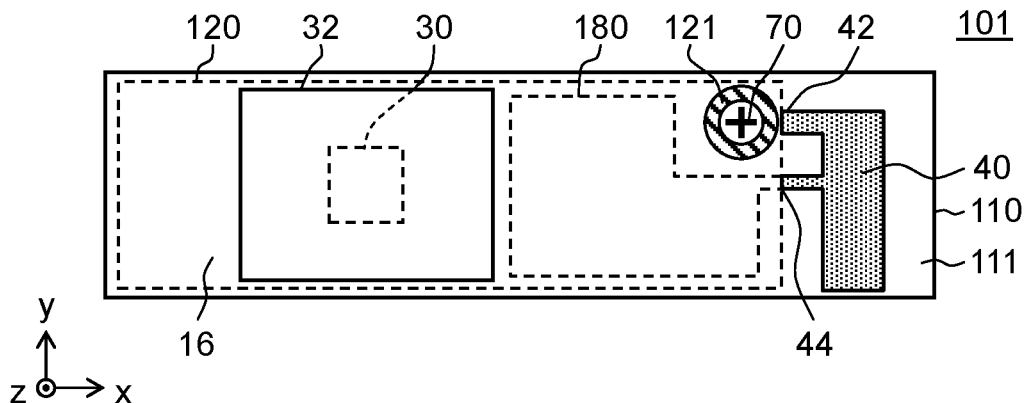
FIG. 5A is a top view schematically showing an example of an external appearance of a wireless module in a second exemplary embodiment.

FIG. 5A is a top view schematically showing an example of an external appearance of wireless module 101 in the second exemplary embodiment.

Figure 5B:
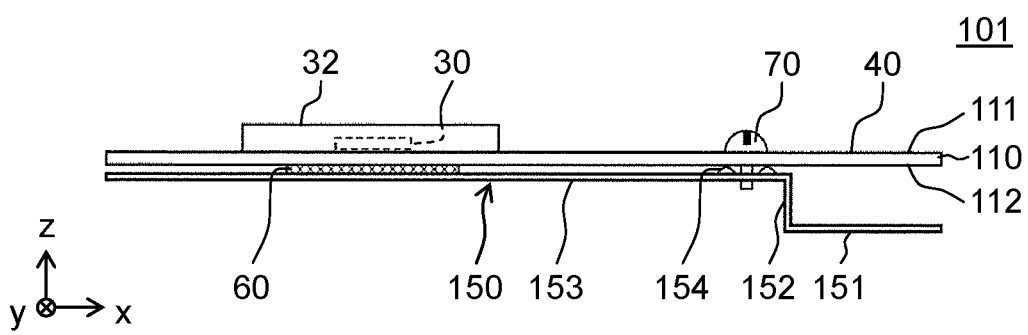
FIG. 5B is a side view schematically showing the example of the external appearance of the wireless module in the second exemplary embodiment.

FIG. 5B is a side view schematically showing the example of the external appearance of wireless module 101 in the second exemplary embodiment.

Figure 5C:
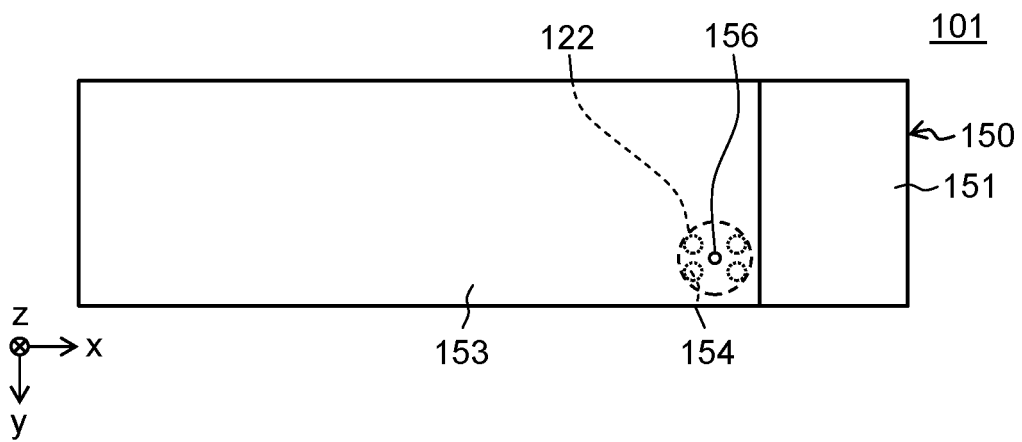
FIG. 5C is a bottom view schematically showing the example of the external appearance of the wireless module in the second exemplary embodiment.

FIG. 5C is a bottom view schematically showing the example of the external appearance of wireless module 101 in the second exemplary embodiment.

Figure 6:
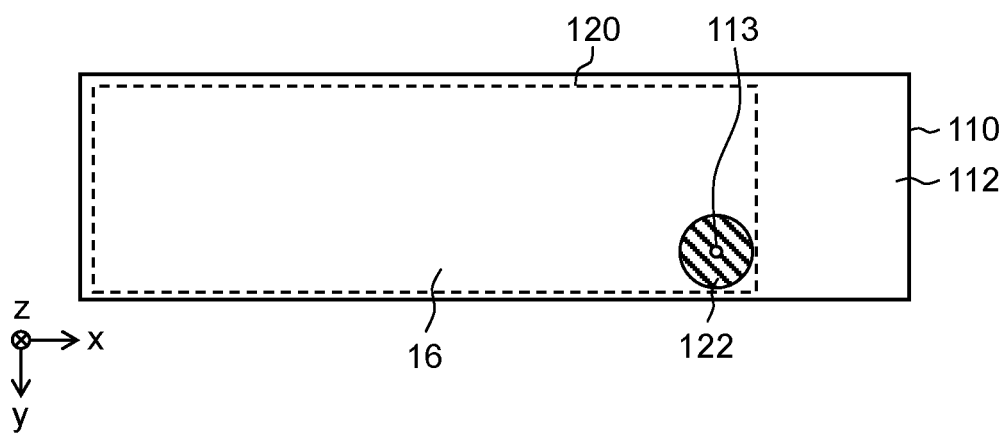
FIG. 6 is a bottom view schematically showing an example of an external appearance of a substrate of the wireless module in the second exemplary embodiment.

FIG. 6 is a bottom view schematically showing an example of an external appearance of substrate 110 of wireless module 101 in the second exemplary embodiment.

As shown in FIG. 5A, wireless module 101 includes substrate 110, ground patterns 120, heat generating component 30, pattern antenna 40, and matching circuit 180. Moreover, as shown in FIG. 5B, wireless module 101 includes base plate 150 and heat conducting member 60.

As shown in FIG. 5A, ground pattern 120 includes exposed portion 121 provided on a first main surface 111 side of substrate 110. Moreover, as shown in FIG. 6, ground pattern 120 further includes exposed portion 122 provided on a second main surface 112 side of substrate 110. Exposed portion 121 and exposed portion 122 are portions of ground patterns 120, which are not covered with resist 16 and exposed to the outside. That is, in the second exemplary embodiment, ground pattern 120 provided on the first main surface 111 side is covered with resist 16 except for exposed portion 121, and ground pattern 120 provided on the second main surface 112 side is covered with resist 16 except for exposed portion 122. In substrate 110, exposed portion 121 and exposed portion 122 are disposed at positions opposed to each other. Base plate 150 is electrically connected to ground patterns 120 via exposed portion 121 and exposed portion 122.

Note that, in this exemplary embodiment, a configuration example in which ground patterns 120 include exposed portion 121 and exposed portion 122 is shown; however, the present disclosure is not limited to this configuration example. In order to electrically connect ground patterns 120 and base plate 150, ground patterns 120 only need to include at least one of exposed portion 121 and exposed portion 122. However, uniformity of potential between ground patterns 120 can be enhanced by a configuration in which ground patterns 120 include both exposed portion 121 and exposed portion 122, and exposed portion 121 and exposed portion 122 are connected to each other via through hole 113 by through hole processing, and by a configuration in which ground patterns 120 include both exposed portion 121 and exposed portion 122, and exposed portion 121 and exposed portion 122 are electrically connected to each other through via electrodes.

As shown in FIG. 6, through hole 113 is formed in a center of exposed portion 122 of ground pattern 120 on substrate 110. As shown in FIGS. 5A and 5B, conductive screw 70, which is an example of a fastening member, is inserted into through hole 113 from the first main surface 111 side of substrate 110. Conductive screw 70 is an example of a conductive fastening member having a threaded portion. Base plate 150 is fixed to substrate 110 by conductive screw 70 inserted into through hole 113. Moreover, exposed portion 121 of ground pattern 120 and base plate 150 are electrically connected to each other via conductive screw 70.

As shown in FIG. 5B, in a similar way to base plate 50 according to the first exemplary embodiment, base plate 150 includes opposed portion 151, gap forming portion 152, and conducting portion 153. Note that it is possible to set a shape of base plate 150 to a variety of shapes similar to those of base plates 50a to 50g according to the respective modification examples of the first exemplary embodiment.

In this exemplary embodiment, base plate 150 further includes one or a plurality (for example, four) of protrusions 154 in conducting portion 153. As shown in FIG. 5C, protrusions 154 are disposed at positions opposed to exposed portion 122 of ground pattern 120, and are in contact with exposed portion 122. This connection is referred to as the connected portion herein. In this way, base plate 150 is electrically connected to ground patterns 120.

As shown in FIG. 5C, in base plate 150, threaded hole 156 is provided at a position corresponding to through hole 113, and the threaded portion of conductive screw 70 that penetrates through hole 113 from the first main surface 111 side is screwed into threaded hole 156. In this way, base plate 150 is fixed to substrate 110, and is electrically connected to exposed portion 121 of ground pattern 120 via conductive screw 70.

In wireless module 101 according to this exemplary embodiment, such a configuration as described above is provided, whereby base plate 150 can be easily attached to substrate 110, and base plate 150 can be electrically connected to ground patterns 120 with increased accuracy. Moreover, in the configuration described in this exemplary embodiment, since base plate 150 is attached to substrate 110 by using conductive screw 70, base plate 150 and substrate 110 can be easily attached and detached to and from each other.

A position at which base plate 150 and ground pattern 120 are connected to each other, that is, disposed positions of exposed portion 121 and exposed portion 122 greatly affect radiation characteristics of the antenna unit configured by pattern antenna 40 and base plate 150. Accordingly, the inventors of the present application focused on that grounding part 42 of pattern antenna 40 is at a reference potential of the antenna unit. Then, the inventors of the present application found that, in wireless module 101, satisfactory and stable radiation characteristics as an antenna unit can be obtained in such a manner that connecting points between base plate 150 and ground pattern 120, the connecting points being made by exposed portion 122 in contact with protrusions 154 of base plate 150, are disposed as close as possible to grounding part 42.

Therefore, in wireless module 101, it is preferable that exposed portion 121 and exposed portion 122 be disposed as closely as possible to grounding part 42 (so as to be much shorter than the wavelength of the electromagnetic wave to be used) as much as structurally possible. For example, the following configuration is preferable: a configuration in which exposed portion 121 is directly connected to grounding part 42, or alternatively, a configuration in which a distance from the connecting point between the base plate 150 and ground pattern 120 to grounding part 42 is set to approximately 1/20 times or less the wavelength of the electromagnetic wave used in wireless module 101. In this case, base plate 150 is connected to ground patterns 120 in proximity to grounding part 42 of pattern antenna 40.

Heat conducting member 60 is a member, which is disposed between base plate 150 and heat generating component 30, and conducts, to base plate 150, the heat generated by heat generating component 30. Heat conducting member 60 is disposed at a position between second main surface 112 of substrate 110 and base plate 150, the position being opposed to heat generating component 30. Moreover, heat conducting member 60 is in contact with second main surface 112 and base plate 150.

As described above, unlike wireless module 1 described in the first exemplary embodiment, wireless module 101 in the second exemplary embodiment does not need to have a structure in which base plate 150 is connected to substrate 110 in proximity to heat generating component 30. In wireless module 101, heat conducting member 60 is disposed between base plate 150 and heat generating component 30, whereby the heat generated by heat generating component 30 is efficiently conducted to base plate 150 via heat conducting member 60.

Heat conducting member 60 includes, for example, a thermally conductive elastomer as a material for use. In this exemplary embodiment, heat conducting member 60 is formed of heat radiating rubber including silicone or the like as a material for use. In this way, since heat conducting member 60 has elasticity, adhesion between substrate 110 and base plate 150 can be enhanced. Therefore, in wireless module 101, thermal resistance between substrate 110 and base plate 150 can be reduced.

Matching circuit 180 is a circuit similar to matching circuit 80 according to the first exemplary embodiment. Respective elements and wires included in matching circuit 180 are disposed at positions, which do not overlap exposed portion 121 of ground pattern 120, on first main surface 111 of substrate 110.

[2-2. Effects and Others]

As described above, in this exemplary embodiment, a wireless module includes: a substrate; a ground pattern formed on the substrate; a heat generating component mounted on the substrate and connected to the ground pattern; a pattern antenna including a grounding part connected to the ground pattern and a power feeding part fed with power from the heat generating component, the pattern antenna being formed on the substrate; and a conductive base plate electrically connected to the ground pattern and disposed opposite to the pattern antenna.

Note that wireless module 101 is an example of the wireless module. Substrate 110 is an example of the substrate. Each of ground patterns 120 is an example of the ground pattern. Heat generating component 30 is an example of the heat generating component. Grounding part 42 is an example of the grounding part. Power feeding part 44 is an example of the power feeding part. Pattern antenna 40 is an example of the pattern antenna. Base plate 150 is an example of the base plate.

In this way, in wireless module 101, the heat generated by heat generating component 30 can be dissipated by base plate 150. Dimensions and shape of base plate 150 are not limited by the frequency and wavelength of the electromagnetic wave used in wireless module 101. Therefore, it is possible to design base plate 150 with dimensions and a shape, which correspond to the heat radiation characteristics required for wireless module 101. In this way, sufficient heat radiation characteristics can be realized in wireless module 101.

The wireless module may further include a fastening member that fastens the substrate and the base plate to each other.

Note that conductive screw 70 is an example of the fastening member.

For example, in the example shown in the second exemplary embodiment, wireless module 101 further includes the fastening member (conductive screw 70) that fastens substrate 110 and base plate 150 to each other.

In this way, in wireless module 101, base plate 150 can be stably fixed to substrate 110.

In the wireless module, the fastening member may have conductivity, and may be in contact with the ground pattern. The base plate may be electrically connected to the ground pattern via the fastening member.

For example, in the example shown in the second exemplary embodiment, in wireless module 101, the fastening member (conductive screw 70) has conductivity, and is in contact with ground patterns 120. Moreover, base plate 150 is electrically connected to ground patterns 120 via the fastening member (conductive screw 70).

In this way, in wireless module 101, base plate 150 can be electrically connected to ground patterns 120 via the conductive screw 70. In this way, in wireless module 101, an antenna unit including base plate 150 and pattern antenna 40 can be formed.

In the wireless module, the base plate may be connected to the ground pattern in proximity to the grounding part.

For example, in the example shown in the second exemplary embodiment, in wireless module 101, the base plate 150 is connected to ground pattern 120 in proximity to grounding part 42.

In this way, in wireless module 101, satisfactory radiation characteristics can be obtained in the antenna unit including pattern antenna 40 and base plate 150. Moreover, in this exemplary embodiment, since the connecting point between base plate 150 and ground pattern 120 is only a portion in proximity to grounding part 42, base plate 150 and grounding pattern 120 can be easily connected to each other.

In the wireless module, the fastening member may have a threaded portion. The base plate may be provided with a threaded hole into which the threaded portion is screwed. The base plate may be electrically connected to the ground patterns via the threaded portion.

Note that threaded hole 156 is an example of the threaded hole.

For example, in the example shown in the second exemplary embodiment, in wireless module 101, the fastening member (conductive screw 70) has the threaded portion, base plate 150 is provided with threaded hole 156 into which the threaded portion is screwed, and base plate 150 is electrically connected to ground patterns 120 via the threaded portion.

In this way, in wireless module 101, base plate 150 can be more stably fixed to substrate 110 by the fastening member having the threaded portion such as the conductive screw 70, and the base plate 150 can be easily attached and detached to and from substrate 110.

In the wireless module, the ground pattern may have an exposed portion exposed to the outside. The base plate may be electrically connected to the ground pattern via the exposed portion.

Note that each of exposed portion 121 and exposed portion 122 is an example of the exposed portion.

For example, in the example shown in the second exemplary embodiment, in wireless module 101, ground patterns 120 include exposed portion 121 and exposed portion 122, which are exposed to the outside, and base plate 150 is electrically connected to ground patterns 120 via exposed portion 121 and exposed portion 122.

In this way, in wireless module 101, exposed portion 121 and exposed portion 122 can be provided at desired positions, and base plate 150 can be electrically connected to ground patterns 120 via exposed portion 121 and exposed portion 122 provided at the desired positions. Therefore, in wireless module 101, base plate 150 can be electrically connected to ground patterns 120 at a position where characteristics of the antenna unit including base plate 150 and pattern antenna 40 are optimized.

Moreover, in wireless module 101, base plate 150 includes protrusions 154 at the positions corresponding to exposed portion 122, and base plate 150 is electrically connected to ground patterns 120 by contact between protrusions 154 and exposed portion 122.

In the wireless module, the base plate may include a protrusion at a position corresponding to the exposed portion. The base plate may be electrically connected to the ground pattern by contact between the protrusion and the exposed portion.

Note that protrusions 154 are an example of the protrusion.

In this way, in wireless module 101, base plate 150 can be electrically connected to ground patterns 120 with a simplified configuration.

The wireless module may further include a heat conducting member, which is disposed between the base plate and the heat generating component, and conducts, to the base plate, heat generated by the heat generating component.

Note that heat conducting member 60 is an example of the heat conducting member.

For example, in the example shown in the second exemplary embodiment, wireless module 101 further includes heat conducting member 60, which is disposed between base plate 150 and heat generating component 30, and conducts, to base plate 150, the heat generated by heat generating component 30.

In this way, in wireless module 101, since heat is efficiently conducted from heat generating component 30 to base plate 150, the heat generated by heat generating component 30 can be efficiently radiated in base plate 150.

In the wireless module, the heat conducting member may include an elastomer as a material for use.

For example, in the example shown in the second exemplary embodiment, in wireless module 101, heat conducting member 60 includes the elastomer as a material for use.

In this way, heat conducting member 60 has elasticity. Therefore, in wireless module 101, adhesion between substrate 110 and base plate 150 can be enhanced. In this way, in wireless module 101, the thermal resistance between substrate 110 and base plate 150 can be reduced.

Third Exemplary Embodiment

Next, wireless module 201 according to a third exemplary embodiment will be described. Wireless module 201 according to this exemplary embodiment has substantially the same configuration as wireless module 101 described in the second exemplary embodiment. However, wireless module 201 described in the third exemplary embodiment is different from wireless module 101 according to the second exemplary embodiment in the connection configuration of the base plate and the ground pattern, and in the shape of the base plate. Hereinafter, with regard to wireless module 201 according to this exemplary embodiment, a description of the matters described in the first and second exemplary embodiments will be omitted as appropriate, and points of difference from wireless module 101 according to the second exemplary embodiment will be mainly described. Note that, constituent elements substantially the same as the constituent elements included in wireless module 101 described in the second exemplary embodiment are denoted by the same reference numerals, and a description thereof is omitted or simplified.

[3-1. Configuration]

First, a configuration of wireless module 201 in this exemplary embodiment will be described with reference to the drawings.

Figure 7A:
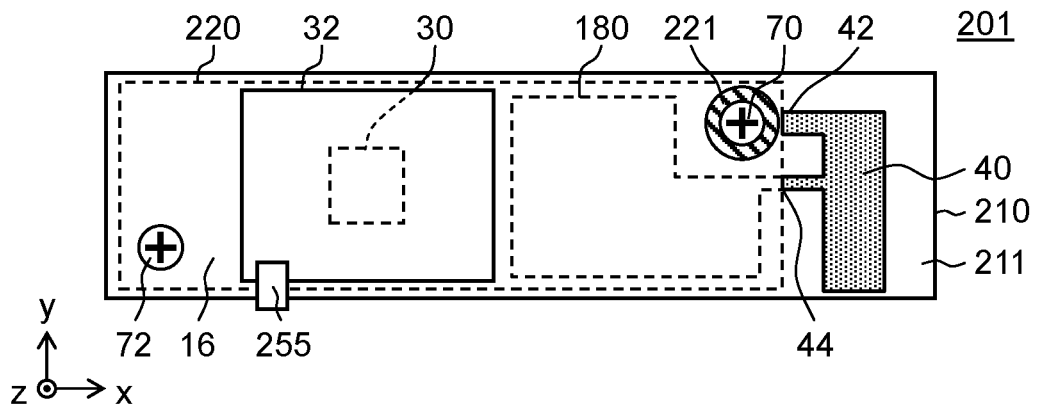
FIG. 7A is a top view schematically showing an example of an external appearance of a wireless module in a third exemplary embodiment.

FIG. 7A is a top view schematically showing an example of an external appearance of wireless module 201 in the third exemplary embodiment.

Figure 7B:
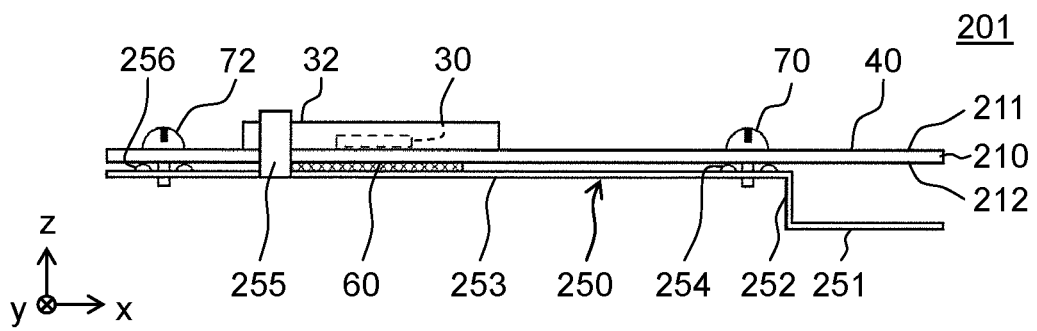
FIG. 7B is a side view schematically showing the example of the external appearance of the wireless module in the third exemplary embodiment.

FIG. 7B is a side view schematically showing the example of the external appearance of wireless module 201 in the third exemplary embodiment.

Figure 7C:
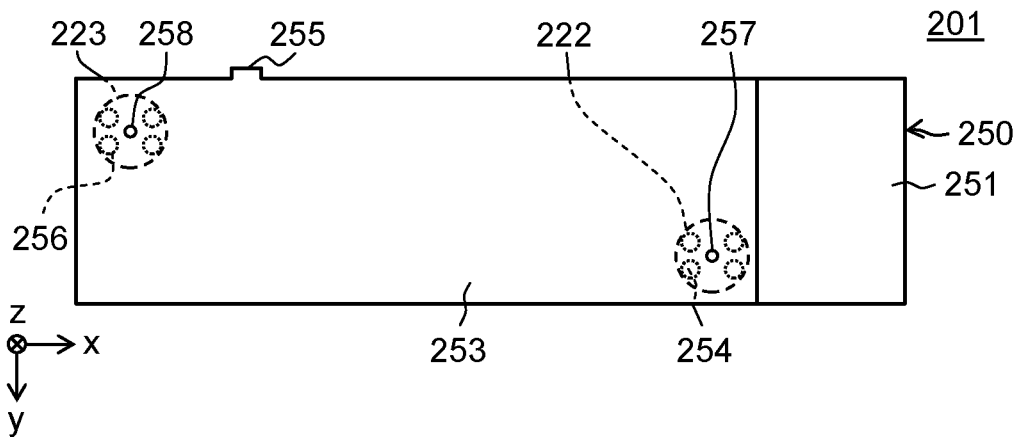
FIG. 7C is a bottom view schematically showing the example of the external appearance of the wireless module in the third exemplary embodiment.

FIG. 7C is a bottom view schematically showing the example of the external appearance of wireless module 201 in the third exemplary embodiment.

Figure 8:
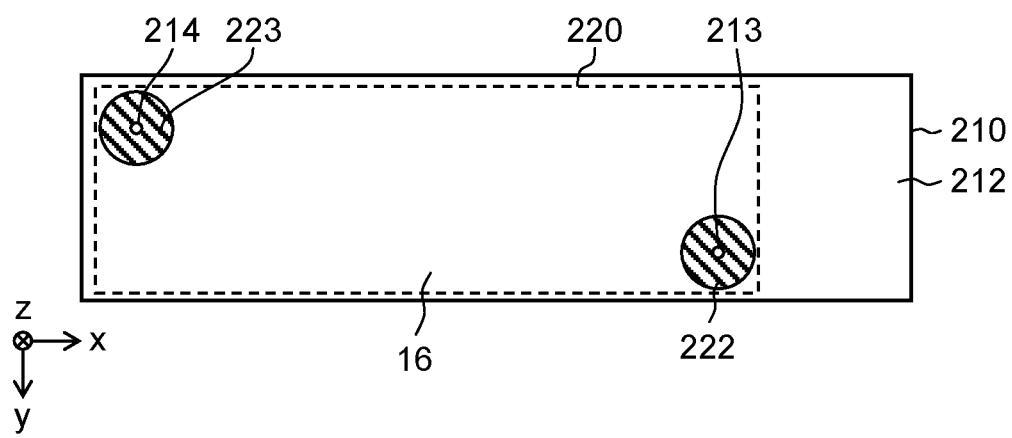
FIG. 8 is a bottom view schematically showing an example of an external appearance of a substrate of the wireless module in the third exemplary embodiment.

FIG. 8 is a bottom view schematically showing an example of an external appearance of substrate 210 of wireless module 201 in the third exemplary embodiment.

As shown in FIG. 7A, wireless module 201 includes substrate 210, ground patterns 220, heat generating component 30, pattern antenna 40, and matching circuit 180. Moreover, as shown in FIG. 7B, wireless module 201 further includes base plate 250 and heat conducting member 60.

As shown in FIG. 7A, ground pattern 220 includes exposed portion 221 provided on a first main surface 211 side of substrate 210. Moreover, as shown in FIG. 8, ground pattern 220 further includes exposed portion 222 and exposed portion 223, which are provided on a second main surface 212 side of substrate 210. Exposed portion 221, exposed portion 222 and exposed portion 223 are portions of ground patterns 220, which are not covered with resist 16 and exposed to the outside. Exposed portion 221 and exposed portion 222 are disposed at positions opposed to each other. Base plate 250 is electrically connected to ground patterns 220 via exposed portion 221, exposed portion 222, and exposed portion 223.

In substrate 210, as shown in FIG. 8, through hole 213 is formed in a center of exposed portion 222 of ground pattern 220, and through hole 214 is formed in a center of exposed portion 223 of ground pattern 220. As shown in FIGS. 7A and 7B, conductive screw 70 is inserted into through hole 213 from the first main surface 211 side of substrate 210, and conductive screw 72 is inserted into through hole 214 from the first main surface 211 side of substrate 210. Base plate 250 is fixed to substrate 210 by conductive screw 70 inserted into through hole 213 and by conductive screw 72 inserted into through hole 214. Moreover, exposed portion 221 of ground pattern 220 and base plate 250 are electrically connected to each other via conductive screw 70.

In wireless module 201 described in this exemplary embodiment, two screws, which are conductive screw 70 and conductive screw 72, are used, whereby substrate 210 and base plate 250 can be fixed more firmly than in wireless module 101 according to the second exemplary embodiment. Moreover, base plate 250 is electrically connected to ground pattern 220 in exposed portion 221, exposed portion 222, and exposed portion 223, and accordingly, the potential of base plate 250 can be further stabilized as compared with that of wireless module 101 according to the second exemplary embodiment.

As shown in FIGS. 7B and 7C, in a similar way to base plate 150 according to the second exemplary embodiment, base plate 250 includes opposed portion 251, gap forming portion 252, conducting portion 253, and one or a plurality (for example, four) of protrusions 254. As shown in FIG. 7C, protrusions 254 are disposed at positions opposed to exposed portion 222 of ground pattern 220, and are in contact with exposed portion 222. In this way, base plate 250 is electrically connected to ground patterns 220. Note that it is possible to set a shape of base plate 250 to a variety of shapes similar to those of base plates 50a to 50g according to the respective modification examples of the first exemplary embodiment.

In this exemplary embodiment, base plate 250 further includes regulating part 255 and one or a plurality (for example, four) of protrusions 256 in conducting portion 253.

Regulating part 255 is a portion that regulates a variation of substrate 210 (variation in a relative position of substrate 210 with respect to base plate 250). As shown in FIGS. 7A and 7B, regulating part 255 is a curved plate-shaped portion protruding in a substantially z-axis positive direction from conducting portion 253 of base plate 250. In this exemplary embodiment, regulating part 255 is integrally formed with other portions of base plate 250. As shown in FIGS. 7A and 7B, regulating part 255 extends from conducting portion 253 to a position, which is opposed to first main surface 211 of substrate 210, via an end on a y-axis direction negative side of substrate 210.

Regulating part 255 includes such a configuration as described above. In this way, for example, when conductive screw 72 is screwed into base plate 250 through substrate 210, regulating part 255 regulates the variation of the relative position between substrate 210 and base plate 250 due to rotation of substrate 210 together with conductive screw 72. In this way, base plate 250 can be easily attached to substrate 210.

Moreover, regulating part 255 also regulates a variation of a relative position of substrate 210 with respect to base plate 250 in a direction perpendicular to first main surface 211 of substrate 210. In wireless module 201 described in this exemplary embodiment, in some cases, for example, substrate 210 may be warped by the heat generated by heat generating component 30, and such a portion where shield case 32 and the like are disposed may move in the z-axis positive direction. In this case, regulating part 255 abuts against a surface on the z-axis direction positive side of shield case 32, thereby suppressing warping of substrate 210.

As shown in FIG. 7C, protrusions 256 are disposed at positions opposed to exposed portion 223 of ground pattern 220, and are in contact with exposed portion 223. In this way, base plate 250 is electrically connected to ground patterns 220 not only in exposed portion 221 and exposed portion 222 but also in exposed portion 223.

As shown in FIG. 7C, in base plate 250, threaded hole 257 is formed at a position corresponding to through hole 213, and threaded hole 258 is formed at a position corresponding to through hole 214. Then, conductive screw 70 that penetrates through hole 213 from the first main surface 211 side is screwed into threaded hole 257, and conductive screw 72 that penetrates through hole 214 from the first main surface 211 side is screwed into screw hole 258. In this way, base plate 250 is fixed to substrate 210, and is electrically connected to exposed portion 221 of ground pattern 220 via conductive screw 70.

In wireless module 201 according to this exemplary embodiment, such a configuration as described above is provided, whereby base plate 250 can be easily attached to substrate 210, and base plate 250 can be electrically connected to ground patterns 220 with increased accuracy.

[3-2. Effects and Others]

As described above, in this exemplary embodiment, a wireless module includes: a substrate; a ground pattern formed on the substrate; a heat generating component mounted on the substrate and connected to the ground pattern; a pattern antenna including a grounding part connected to the ground pattern and a power feeding part fed with power from the heat generating component, the pattern antenna being formed on the substrate; and a conductive base plate electrically connected to the ground pattern and disposed opposite to the pattern antenna.

Note that wireless module 201 is an example of the wireless module. Substrate 210 is an example of the substrate. Each of ground patterns 220 is an example of the ground pattern. Heat generating component 30 is an example of the heat generating component. Grounding part 42 is an example of the grounding part. Power feeding part 44 is an example of the power feeding part. Pattern antenna 40 is an example of the pattern antenna. Base plate 250 is an example of the base plate.

In this way, in wireless module 201, the heat generated by heat generating component 30 can be dissipated by base plate 250. Dimensions and shape of base plate 250 are not limited by the frequency and wavelength of the electromagnetic wave used in wireless module 201. Therefore, it is possible to design base plate 250 with dimensions and a shape, which correspond to the heat radiation characteristics required for wireless module 201. In this way, sufficient heat radiation characteristics can be realized in wireless module 201.

Moreover, in wireless module 201, base plate 250 includes regulating part 255 that regulates the variation of the relative position of substrate 210 with respect to base plate 250.

In this way, in wireless module 201, base plate 250 can be easily attached to substrate 210. Moreover, in wireless module 201, deformation caused by the heat and the like of substrate 210 can be suppressed.

Fourth Exemplary Embodiment

Next, wireless module 301 according to a fourth exemplary embodiment will be described. Wireless module 301 according to this exemplary embodiment has substantially the same configuration as wireless module 101 described in the second exemplary embodiment. However, wireless module 301 described in the fourth exemplary embodiment is different from wireless module 101 according to the second exemplary embodiment in a positional relationship between the substrate and the plate, and in the shape of the base plate. Hereinafter, with regard to wireless module 301 according to this exemplary embodiment, a description of the matters described in the first and second exemplary embodiments will be omitted as appropriate, and points of difference from wireless module 101 according to the second exemplary embodiment will be mainly described. Note that, constituent elements substantially the same as the constituent elements included in wireless module 101 described in the second exemplary embodiment are denoted by the same reference numerals, and a description thereof is omitted or simplified.

[4-1. Configuration]

First, a configuration of wireless module 301 in this exemplary embodiment will be described with reference to the drawings.

Figure 9A:
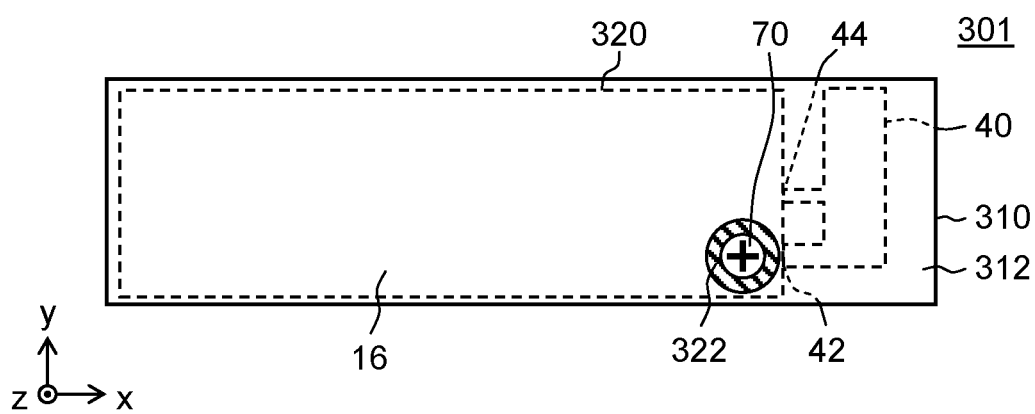
FIG. 9A is a top view schematically showing an example of an external appearance of a wireless module in a fourth exemplary embodiment.

FIG. 9A is a top view schematically showing an example of an external appearance of wireless module 301 in the fourth exemplary embodiment.

Figure 9B:
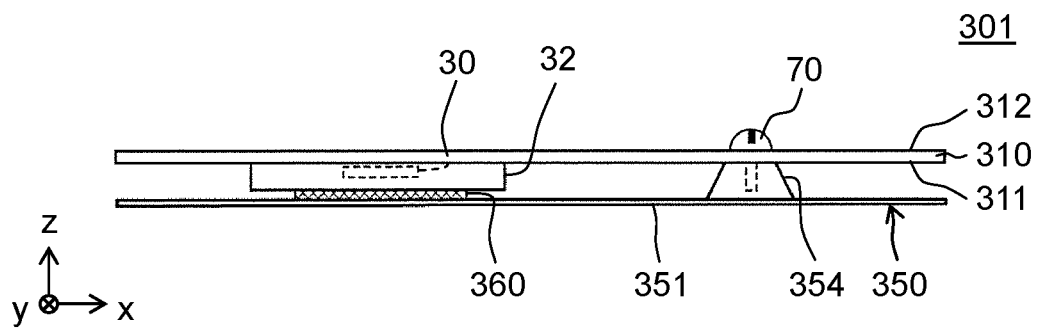
FIG. 9B is a side view schematically showing the example of the external appearance of the wireless module in the fourth exemplary embodiment.

FIG. 9B is a side view schematically showing the example of the external appearance of wireless module 301 in the fourth exemplary embodiment.

Figure 10:
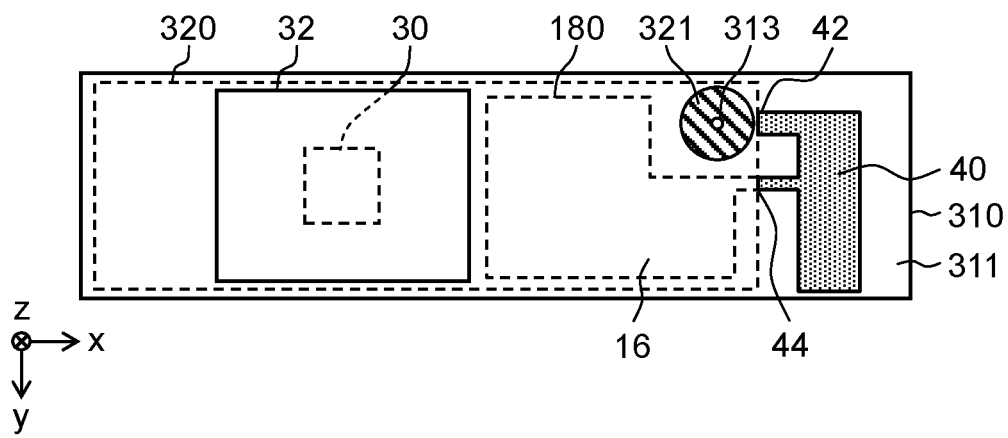
FIG. 10 is a bottom view schematically showing an example of an external appearance of a substrate of the wireless module in the fourth exemplary embodiment.

FIG. 10 is a bottom view schematically showing an example of an external appearance of substrate 310 of wireless module 301 in the fourth exemplary embodiment.

In wireless module 301 according to this exemplary embodiment, as shown in FIG. 9B, base plate 350 is disposed at a position opposed to first main surface 311 of substrate 310, on which pattern antenna 40 and the like are provided.

As shown in FIG. 9A, in a similar way to wireless module 101 according to the second exemplary embodiment, wireless module 301 according to this exemplary embodiment includes substrate 310, ground patterns 320, and pattern antenna 40. Moreover, as shown in FIG. 9B, wireless module 301 includes heat generating component 30, base plate 350, and heat conducting member 360. Moreover, as shown in FIG. 10, wireless module 301 further includes matching circuit 180.

Substrate 310 has substantially the same configuration as that of substrate 110 according to the second exemplary embodiment.

As shown in FIG. 10, ground pattern 320 includes exposed portion 321 on a first main surface 311 side of substrate 310. Moreover, as shown in FIG. 9A, ground pattern 320 includes exposed portion 322 on a second main surface 312 side of substrate 310. Exposed portion 321 and exposed portion 322 are portions of ground patterns 320, which are not covered with resist 16 and exposed to the outside. Moreover, as shown in FIG. 10, in substrate 310, through hole 313 is formed in a center of exposed portion 321. In this exemplary embodiment, conductive screw 70 is inserted into through hole 313 from the second main surface 312 side of substrate 310. Base plate 350 is fixed to substrate 310 by conductive screw 70 inserted into through hole 313.

As shown in FIG. 9B, base plate 350 includes opposed portion 351 and truncated cone portion 354. That is, in this exemplary embodiment, base plate 350 has a substantially flat plate shape. More specifically, base plate 350 includes: substantially flat plate-shaped opposed portion 351; and truncated cone portion 354, which has a substantially truncated conical shape and protrudes from opposed portion 351 toward the substrate 310 side (that is, in the z-axis positive direction). At truncated cone portion 354, base plate 350 is in contact with exposed portion 321, thereby being electrically connected to ground patterns 320. A threaded hole (not shown) is formed at a position, which corresponds to through hole 313, in a center of truncated cone portion 354. Then, conductive screw 70 that penetrates the through hole 313 from the second main surface 312 side is screwed into the threaded hole. In this way, base plate 350 is fixed to substrate 310, and is electrically connected to exposed portion 322 of ground pattern 320 via conductive screw 70.

Moreover, the heat generated by heat generating component 30 is conducted to base plate 350 via heat conducting member 360 having substantially the same properties as heat conducting member 60. In this way, in wireless module 301, the heat generated by heat generating component 30 can be dissipated in base plate 350.

Wireless module 301 according to this exemplary embodiment includes base plate 350 configured by including flat opposed portion 351 and truncated cone portion 354. As described above, in this exemplary embodiment, the configuration of base plate 350 can be simplified.

Note that, although such a configuration example in which base plate 350 includes truncated cone portion 354 is illustrated in this exemplary embodiment, base plate 350 does not necessarily need to include truncated cone portion 354. For example, instead of truncated cone portion 354, wireless module 301 may include a conductive washer or the like, which is disposed between exposed portion 321 and base plate 350.

Heat conducting member 360 is disposed between base plate 350 and heat generating component 30. In this exemplary embodiment, heat conducting member 360 is disposed at a position in contact with shield case 32 and base plate 350. In wireless module 301, heat conducting member 360 is disposed as described above, whereby, in wireless module 301, the heat generated by heat generating component 30 is efficiently conducted to base plate 350.

Note that, in wireless module 301 according to this exemplary embodiment, shield case 32 and base plate 350 may be integrated with each other. In this way, thermal resistance between shield case 32 and base plate 350 can be reduced, and accordingly, heat radiation characteristics of wireless module 301 can be enhanced.

[4-2. Effects and Others]

As described above, in this exemplary embodiment, a wireless module includes: a substrate; a ground pattern formed on the substrate; a heat generating component mounted on the substrate and connected to the ground pattern; a pattern antenna including a grounding part connected to the ground pattern and a power feeding part fed with power from the heat generating component, the pattern antenna being formed on the substrate; and a conductive base plate electrically connected to the ground pattern and disposed opposite to the pattern antenna.

Note that wireless module 301 is an example of the wireless module. Substrate 310 is an example of the substrate. Each of ground patterns 320 is an example of the ground pattern. Heat generating component 30 is an example of the heat generating component. Grounding part 42 is an example of the grounding part. Power feeding part 44 is an example of the power feeding part. Pattern antenna 40 is an example of the pattern antenna. Base plate 350 is an example of the base plate.

In this way, in wireless module 301, the heat generated by heat generating component 30 can be dissipated by base plate 350. Dimensions and shape of base plate 350 are not limited by the frequency and wavelength of the electromagnetic wave used in wireless module 301. Therefore, it is possible to design base plate 350 with dimensions and a shape, which correspond to the heat radiation characteristics required for wireless module 301. In this way, sufficient heat radiation characteristics can be realized in wireless module 301.

The wireless module may further include a heat conducting member, which is disposed between the base plate and the heat generating component, and conducts, to the base plate, heat generated by the heat generating component.

Note that heat conducting member 360 is an example of the heat conducting member.

For example, in the example shown in the fourth exemplary embodiment, wireless module 301 further includes heat conducting member 360, which is disposed between base plate 350 and heat generating component 30, and conducts, to base plate 350, the heat generated by heat generating component 30.

In this way, in wireless module 301, since heat is efficiently conducted from heat generating component 30 to base plate 350, the heat generated by heat generating component 30 can be efficiently radiated in base plate 350.

Moreover, in wireless module 301, base plate 350 has a substantially flat plate shape.

In this way, the configuration of base plate 350 can be simplified in wireless module 301.

Fifth Exemplary Embodiment

Next, wireless module 401 according to a fifth exemplary embodiment will be described. Wireless module 401 according to this exemplary embodiment has substantially the same configuration as wireless module 101 described in the second exemplary embodiment. However, wireless module 401 described in the fifth exemplary embodiment is different from wireless module 101 according to the second exemplary embodiment in that the base plate includes a plurality of radiation fins Hereinafter, with regard to wireless module 401 according to this exemplary embodiment, a description of the matters described in the first and second exemplary embodiments will be omitted as appropriate, and points of difference from wireless module 101 according to the second exemplary embodiment will be mainly described. Note that, constituent elements substantially the same as the constituent elements included in wireless module 101 described in the second exemplary embodiment are denoted by the same reference numerals, and a description thereof is omitted or simplified.

[5-1. Configuration]

First, a configuration of wireless module 401 in this exemplary embodiment will be described with reference to the drawings.

Figure 11:
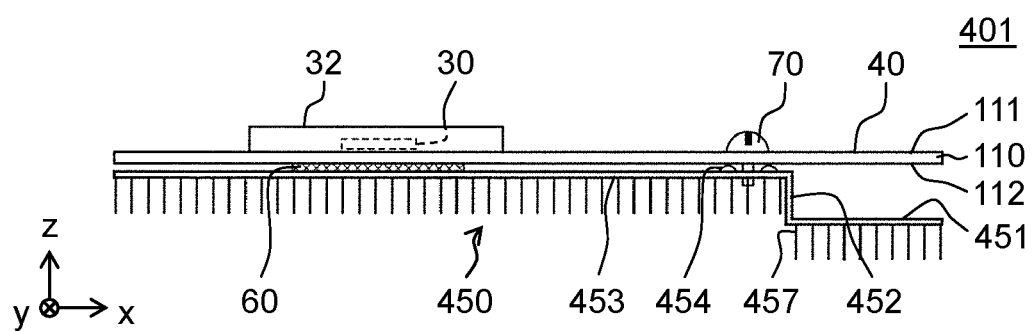
FIG. 11 is a side view schematically showing an example of an external appearance of a wireless module in a fifth exemplary embodiment.

FIG. 11 is a side view schematically showing an example of an external appearance of wireless module 401 in the fifth exemplary embodiment.

As shown in FIG. 11, wireless module 401 is different from wireless module 101 according to the second exemplary embodiment in the configuration of base plate 450, and substantially coincides with wireless module 101 in other configurations.

In a similar way to wireless module 101 according to the second exemplary embodiment, base plate 450 according to this exemplary embodiment includes opposed portion 451, gap forming portion 452, conducting portion 453, and protrusion 454. Base plate 450 further includes a plurality of radiation fins 457 on the z-axis direction negative side.

In wireless module 401 according to this exemplary embodiment, base plate 450 includes the plurality of radiation fins 457, whereby heat radiation characteristics in base plate 450 can be enhanced. Note that, although this exemplary embodiment illustrates such a configuration example in which radiation fins 457 are provided on an entire surface on the z-axis direction negative side of base plate 450, the radiation fins 457 may be provided only on a part of the surface. For example, radiation fins 457 may be provided only on conducting portion 453. Moreover, only one radiation fin 457 may be provided on base plate 450. Note that it is possible to set a shape of base plate 450 to a variety of shapes similar to those of base plates 50a to 50g according to the respective modification examples of the first exemplary embodiment.

[5-2. Effects and Others]

As described above, in this exemplary embodiment, a wireless module includes: a substrate; a ground pattern formed on the substrate; a heat generating component mounted on the substrate and connected to the ground pattern; a pattern antenna including a grounding part connected to the ground pattern and a power feeding part fed with power from the heat generating component, the pattern antenna being formed on the substrate; and a conductive base plate electrically connected to the ground pattern and disposed opposite to the pattern antenna.

Note that wireless module 401 is an example of the wireless module. Substrate 110 is an example of the substrate. Base plate 450 is an example of the base plate.

In this way, in wireless module 401, the heat generated by heat generating component 30 can be dissipated by base plate 450. Dimensions and shape of base plate 450 are not limited by the frequency and wavelength of the electromagnetic wave used in wireless module 401. Therefore, it is possible to design base plate 450 with dimensions and a shape, which correspond to the heat radiation characteristics required for wireless module 401. In this way, sufficient heat radiation characteristics can be realized in wireless module 401.

Moreover, in wireless module 401, base plate 450 includes radiation fins 457.

In this way, heat radiation characteristics of wireless module 401 can be enhanced.

Sixth Exemplary Embodiment

Next, wireless module 501 according to a sixth exemplary embodiment will be described. The wireless module according to this exemplary embodiment has substantially the same configuration as wireless module 101 described in the second exemplary embodiment. However, wireless module 501 described in the sixth exemplary embodiment is different from wireless module 101 according to the second exemplary embodiment mainly in that the pattern antenna is configured to be adaptable for a multi-band (that is, a plurality of frequency bands). Hereinafter, with regard to wireless module 501 according to this exemplary embodiment, a description of the matters described in the first and second exemplary embodiments will be omitted as appropriate, and points of difference from wireless module 101 according to the second exemplary embodiment will be mainly described. Note that, constituent elements substantially the same as the constituent elements included in wireless module 101 described in the second exemplary embodiment are denoted by the same reference numerals, and a description thereof is omitted or simplified.

[6-1. Configuration]

First, a configuration of wireless module 501 in this exemplary embodiment will be described with reference to the drawings.

Figure 12:
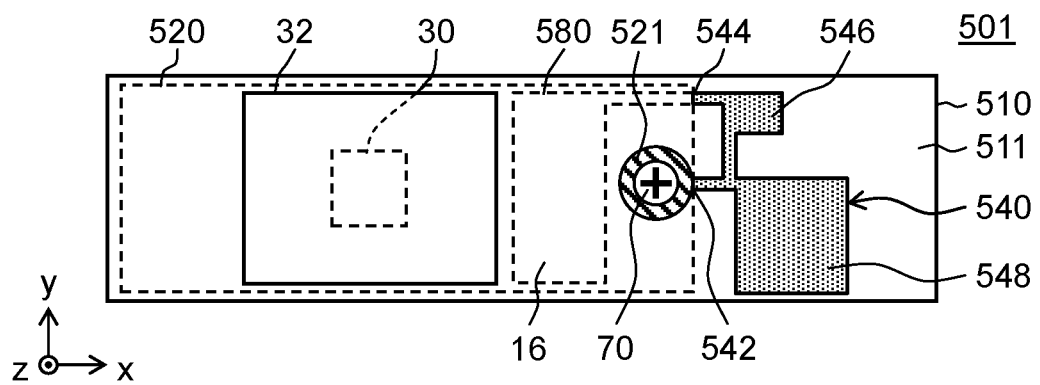
FIG. 12 is a top view schematically showing an example of an external appearance of a wireless module in a sixth exemplary embodiment.

FIG. 12 is a top view schematically showing an example of an external appearance of wireless module 501 in the sixth exemplary embodiment.

As shown in FIG. 12, wireless module 501 has a configuration in which pattern antenna 540 is adaptable for a multi-band. In a similar way to pattern antenna 40 according to the second exemplary embodiment, pattern antenna 540 includes grounding part 542 and power feeding part 544.

Moreover, pattern antenna 540 includes: first antenna part 546 corresponding to a first frequency band; and second antenna part 548 corresponding to a second frequency band that is a frequency band lower than the first frequency band. In this way, pattern antenna 540 can be made adaptable for two frequency bands. The first frequency band is, for example, the 5 GHz band, and the second frequency band is, for example, the 2.4 GHz band.

In this exemplary embodiment, pattern antenna 540 is adaptable for two frequency bands, whereby a shape of pattern antenna 540 is complicated. However, in wireless module 501, pattern antenna 540 can be easily formed by patterning using metal foil. Note that, although this exemplary embodiment illustrates such a configuration example in which pattern antenna 540 is adaptable for two frequency bands, the configuration of pattern antenna 540 is not limited to this. Pattern antenna 540 may have a configuration adaptable for three or more frequency bands.

Moreover, in wireless module 501, configurations of ground patterns 520 and matching circuit 580 are different from those in wireless module 101 according to the second exemplary embodiment. Matching circuit 580 is substantially the same as matching circuit 180 according to the second exemplary embodiment; however, matching circuit 580 is configured to be adaptable for pattern antenna 540. Moreover, in wireless module 501, a disposed position of exposed portion 521 in ground pattern 520 is different from the disposed position of exposed portion 121 of ground pattern 120 according to the second exemplary embodiment. Exposed portion 521 is a portion of ground pattern 520, which is not covered with resist 16 and exposed to the outside. In this exemplary embodiment, exposed portion 521 is disposed at a center in the y-axis direction of ground pattern 520 so as to correspond to the position of grounding part 542 of pattern antenna 540. In this way, in wireless module 501, exposed portion 521 can be disposed in proximity to grounding part 542 of pattern antenna 540. Respective elements and wires included in matching circuit 580 are disposed at positions, which do not overlap exposed portion 521 of ground pattern 520, on first main surface 511 of substrate 510.

[6-2. Effects and Others]

As described above, in this exemplary embodiment, a wireless module includes: a substrate; a ground pattern formed on the substrate; a heat generating component mounted on the substrate and connected to the ground pattern; a pattern antenna including a grounding part connected to the ground pattern and a power feeding part fed with power from the heat generating component, the pattern antenna being formed on the substrate; and a conductive base plate electrically connected to the ground pattern and disposed opposite to the pattern antenna.

Note that wireless module 501 is an example of the wireless module. Substrate 510 is an example of the substrate. Each of ground patterns 520 is an example of the ground pattern. Heat generating component 30 is an example of the heat generating component. Grounding part 542 is an example of the grounding part. Power feeding part 544 is an example of the power feeding part. Pattern antenna 540 is an example of the pattern antenna.

In this way, in wireless module 501, the heat generated by heat generating component 30 can be dissipated by base plate 150 (not shown in FIG. 12). Dimensions and shape of base plate 150 are not limited by the frequency and wavelength of the electromagnetic wave used in wireless module 501. Therefore, it is possible to design base plate 150 with dimensions and a shape, which correspond to the heat radiation characteristics required for wireless module 501. In this way, sufficient heat radiation characteristics can be realized in wireless module 501.

In the wireless module, the pattern antenna may have a shape adaptable for the multi-band.

Note that pattern antenna 540 is an example of the pattern antenna having the shape adaptable for the multi-band.

For example, in the example shown in the sixth exemplary embodiment, in wireless module 501, pattern antenna 540 has the shape adaptable for the multi-band.

In this way, wireless module 501 can be made adaptable for the multi-band. Pattern antenna 540 is adaptable for the multi-band, whereby the shape of pattern antenna 540 becomes complicated. However, in wireless module 501, pattern antenna 540 can be easily formed by patterning using metal foil.

Seventh Exemplary Embodiment

Next, wireless module 601 according to a seventh exemplary embodiment will be described. The wireless module according to this exemplary embodiment has substantially the same configuration as wireless module 101 described in the second exemplary embodiment. However, wireless module 601 described in the seventh exemplary embodiment is different from wireless module 101 according to the second exemplary embodiment mainly in that wireless module 601 includes a plurality of antenna units. Wireless module 601 according to this exemplary embodiment is, for example, a wireless module of the MIMO (Multi-Input Multi-Output) method. Hereinafter, with regard to wireless module 601 according to this exemplary embodiment, a description of the matters described in the first and second exemplary embodiments will be omitted as appropriate, and points of difference from wireless module 101 according to the second exemplary embodiment will be mainly described. Note that, constituent elements substantially the same as the constituent elements included in wireless module 101 described in the second exemplary embodiment are denoted by the same reference numerals, and a description thereof is omitted or simplified.

[7-1. Configuration]

First, a configuration of wireless module 601 in this exemplary embodiment will be described with reference to the drawings.

Figure 13A:
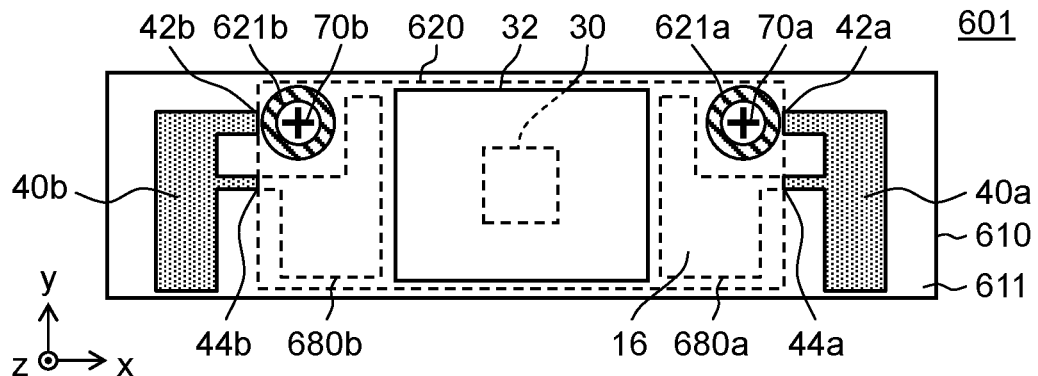
FIG. 13A is a top view schematically showing an example of an external appearance of a wireless module in a seventh exemplary embodiment.

FIG. 13A is a top view schematically showing an example of an external appearance of wireless module 601 in the seventh exemplary embodiment.

Figure 13B:
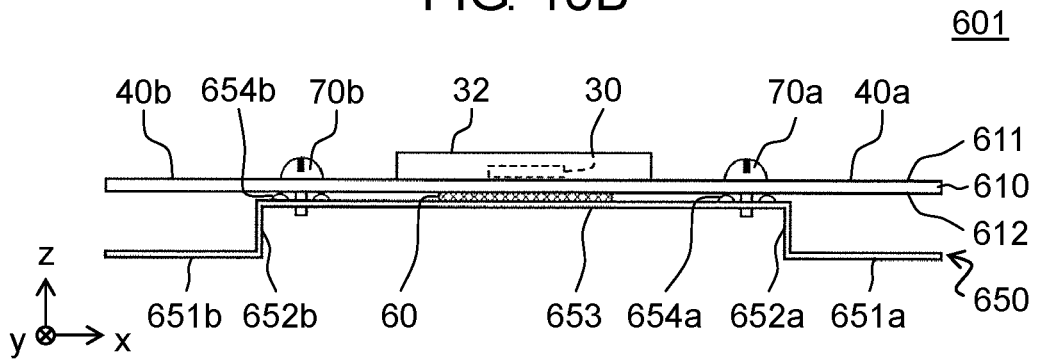
FIG. 13B is a side view schematically showing the example of the external appearance of the wireless module in the seventh exemplary embodiment.

FIG. 13B is a side view schematically showing the example of the external appearance of wireless module 601 in the seventh exemplary embodiment.

Figure 13C:
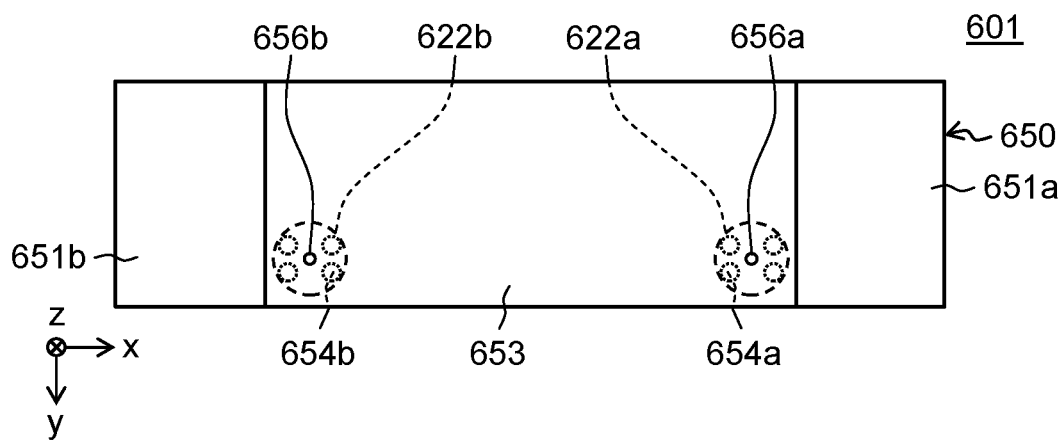
FIG. 13C is a bottom view schematically showing the example of the external appearance of the wireless module in the seventh exemplary embodiment.

FIG. 13C is a bottom view schematically showing the example of the external appearance of wireless module 601 in the seventh exemplary embodiment.

Figure 14:
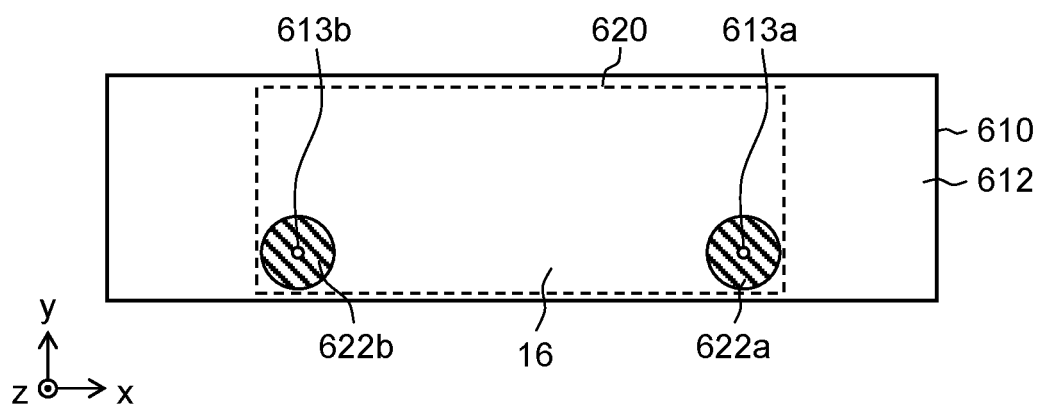
FIG. 14 is a bottom view schematically showing an example of an external appearance of a substrate of the wireless module in the seventh exemplary embodiment.

FIG. 14 is a bottom view schematically showing an example of an external appearance of substrate 610 of wireless module 601 in the seventh exemplary embodiment.

As shown in FIG. 13A, wireless module 601 includes substrate 610, ground patterns 620, heat generating component 30, shield case 32, pattern antenna 40a and pattern antenna 40b, and matching circuit 680a and matching circuit 680b. Matching circuit 680a and matching circuit 680b are substantially the same as matching circuit 180 according to the second exemplary embodiment. Moreover, as shown in FIG. 13B, wireless module 601 further includes base plate 650 and heat conducting member 60.

In wireless module 601 described in this exemplary embodiment, as shown in FIGS. 13A and 13B, each of pattern antenna 40a and pattern antenna 40b and base plate 650 constitute each of the antenna units. As shown in FIG. 13A, power feeding part 44a of pattern antenna 40a is fed with power from heat generating component 30 via matching circuit 680a, and power feeding part 44b of pattern antenna 40b is fed with power from heat generating component 30 via the matching circuit 680b. Moreover, pattern antenna 40a is connected to ground pattern 620 via grounding part 42a, and pattern antenna 40b is connected to ground pattern 620 via grounding part 42b.

As shown in FIG. 13A, ground pattern 620 includes exposed portion 621a and exposed portion 621b, which are provided on a first main surface 611 side of substrate 610. Moreover, as shown in FIG. 13C, ground pattern 620 further includes exposed portion 622a and exposed portion 622b, which are provided on a second main surface 612 side of substrate 610. Exposed portion 621a, exposed portion 621b, exposed portion 622a, and exposed portion 622b are portions of ground patterns 620, which are not covered with resist 16 and exposed to the outside.

In wireless module 601, exposed portion 621a is disposed at a position opposed to exposed portion 622a, and exposed portion 621b is disposed at a position opposed to exposed portion 622b. In wireless module 601, base plate 650 is electrically connected to ground pattern 620 via exposed portion 621a, exposed portion 621b, exposed portion 622a, and exposed portion 622b. Exposed portion 621a and exposed portion 622a are disposed as closely as possible to grounding part 42a as far as structurally possible, and exposed portion 621*b* and exposed portion 622*b* are disposed as closely as possible to grounding part 42*b* as much as structurally possible.

In substrate 610, as shown in FIG. 14, through hole 613*a* is formed in a center of exposed portion 622*a* of ground pattern 620, and through hole 613*b* is formed in a center of exposed portion 622*b* of ground pattern 620. As shown in FIGS. 13A and 13B, conductive screw 70*a* is inserted into through hole 613*a*, which is formed in substrate 610, from the first main surface 611 side of substrate 610, and conductive screw 70*b* is inserted into through hole 613*b*, which is formed in substrate 610, from the first main surface 611 side of substrate 610.

In wireless module 601, base plate 650 is fixed to substrate 610 by conductive screw 70*a* inserted into through hole 613*a* and by conductive screw 70*b* inserted into through hole 613*b*. Moreover, in wireless module 601, exposed portion 621*a* and exposed portion 622*a* of ground patterns 620 and base plate 650 are electrically connected to each other via conductive screw 70*a*, and exposed portion 621*b* and exposed portion 622*b* of the ground pattern 620 and base plate 650 are electrically connected to each other via conductive screw 70*b*.

In this exemplary embodiment, two screws, which are conductive screw 70*a* and conductive screw 70*b*, are used, whereby substrate 610 and base plate 650 can be fixed more firmly than in wireless module 101 according to the second exemplary embodiment. Moreover, base plate 650 is electrically connected to ground pattern 620 in exposed portion 621*a*, exposed portion 621*b*, exposed portion 622*a*, and exposed portion 622*b*, and accordingly, the potential of base plate 650 can be further stabilized as compared with that of wireless module 101 according to the second exemplary embodiment.

In wireless module 601 including the plurality of antenna units, base plate 650 is connected to ground pattern 620 individually in proximity to grounding part 42*a* of pattern antenna 40*a* and in proximity to grounding part 42*b* of pattern antenna 40*b*. In this way, in wireless module 601, satisfactory radiation characteristics can be obtained in each of the antenna units.

As shown in FIGS. 13B and 13C, wireless module 601 described in this exemplary embodiment includes two opposed portions and two gap forming portions on base plate 650. Specifically, base plate 650 includes opposed portion 651*a* and gap forming portion 652*a* at positions corresponding to pattern antenna 40*a*, and includes opposed portion 651*b* and gap forming portion 652*b* at positions corresponding to pattern antenna 40*b*. Moreover, base plate 650 includes one or a plurality (for example, four) of protrusions 654*a* and one or a plurality (for example, four) of protrusions 654*b*. Moreover, base plate 650 includes conducting portion 653 between gap forming portion 652*a* and gap forming portion 652*b*.

As shown in FIG. 13C, protrusions 654*a* are disposed at positions opposed to exposed portion 622*a* of ground pattern 620, and are in contact with exposed portion 622*a*. Protrusions 654*b* are disposed at positions opposed to exposed portion 622*b* of ground pattern 620, and are in contact with exposed portion 622*b*. In this way, base plate 650 is electrically connected to ground patterns 620 at exposed portion 622*a* and exposed portion 622*b*.

As shown in FIG. 13C, in base plate 650, threaded hole 656*a* is formed at a position corresponding to through hole 613*a*, and threaded hole 656*b* is formed at a position corresponding to through hole 613*b*. Then, conductive screw 70*a* that penetrates through hole 613*a* from the first main surface 611 side is screwed into threaded hole 656*a*, and conductive screw 70*b* that penetrates through hole 613*b* from the first main surface 611 side is screwed into screw hole 656*b*. In this way, base plate 650 is fixed to substrate 610, and is electrically connected to exposed portion 621*a* of ground pattern 620 via conductive screw 70*a*, and is electrically connected to exposed portion 621*b* of ground pattern 620 via conductive screw 70*b*.

In wireless module 601 according to this exemplary embodiment, such a configuration as described above is provided, whereby base plate 650 can be easily attached to substrate 610, and base plate 650 can be electrically connected to ground patterns 620 with increased accuracy.

Note that it is possible to set a shape of base plate 650 to a variety of shapes similar to those of base plates 50*a* to 50*g* according to the respective modification examples of the first exemplary embodiment.

In wireless module 601 according to this exemplary embodiment, as an example is shown in FIG. 13A, it is preferable that similar elements (for example, pattern antenna 40*a* and pattern antenna 40*b*), which constitute the antenna units, be disposed at positions symmetric to each other with respect to heat generating component 30 and shield case 32, which are disposed at the center of substrate 610. As described above, in wireless module 601, the plurality of antenna units are disposed symmetrically to each other on the same substrate, whereby spatial correlation between the respective antennas is lowered, and a satisfactory MIMO effect can be obtained.

Moreover, in wireless module 601, a similar effect to that mentioned above can be obtained even if a configuration is adopted in which pattern antennas having a different shape are disposed on substrate 610.

[7-2. Effects and Others]

As described above, in this exemplary embodiment, a wireless module includes: a substrate; a ground pattern formed on the substrate; a heat generating component mounted on the substrate and connected to the ground pattern; a pattern antenna including a grounding part connected to the ground pattern and a power feeding part fed with power from the heat generating component, the pattern antenna being formed on the substrate; and a conductive base plate electrically connected to the ground pattern and disposed opposite to the pattern antenna.

Note that wireless module 601 is an example of the wireless module. Substrate 610 is an example of the substrate. Each of ground patterns 620 is an example of the ground pattern. Heat generating component 30 is an example of the heat generating component. Each of grounding part 42*a* and grounding part 42*b* is an example of the grounding part. Each of power feeding part 44*a* and power feeding part 44*b* is an example of the power feeding part. Each of pattern antenna 40*a* and pattern antenna 40*b* is an example of the pattern antenna.

In this way, in wireless module 601, the heat generated by heat generating component 30 can be dissipated by base plate 650. Dimensions and shape of base plate 650 are not limited by the frequency and wavelength of the electromagnetic wave used in wireless module 601. Therefore, it is possible to design base plate 650 with dimensions and a shape, which correspond to the heat radiation characteristics required for wireless module 601. In this way, sufficient heat radiation characteristics can be realized in wireless module 601.

Moreover, wireless module 601 includes the plurality of pattern antennas (pattern antenna 40*a* and pattern antenna 40*b*), and the plurality of pattern antennas (pattern antenna 40a and pattern antenna 40b) and base plate 650 constitute the plurality of antenna units. In wireless module 601, base plate 650 is connected to ground patterns 620 in proximity to the grounding part of each of the pattern antennas. In this way, in wireless module 601, satisfactory radiation characteristics can be obtained in each of the antenna units. In addition, the antenna units are disposed symmetrically to each other, whereby a satisfactory MIMO effect can be obtained in wireless module 601.

In this way, wireless module 601 of the MIMO system can be realized. Moreover, in each the antenna units of wireless module 601, similar effects to those of wireless module 201 of the second exemplary embodiment can be exerted.

Eighth Exemplary Embodiment

Next, wireless module 701 according to an eighth exemplary embodiment and image display device 790 including wireless module 701 will be described. Wireless module 701 according to this exemplary embodiment has substantially the same configuration as wireless module 101 described in the second exemplary embodiment. However, wireless module 701 described in the eighth exemplary embodiment is different from wireless module 101 according to the second exemplary embodiment in the shape of the base plate, and substantially coincides with wireless module 101 in other configurations. Hereinafter, wireless module 701 according to this exemplary embodiment and image display device 790 including wireless module 701 will be described with reference to the drawings. Note that, constituent elements substantially the same as the constituent elements included in wireless module 101 described in the second exemplary embodiment are denoted by the same reference numerals, and a description thereof is omitted or simplified. Moreover, a description of the matters described in the first and second exemplary embodiments will be omitted as appropriate.

[8-1. Configuration]

Figure 15:
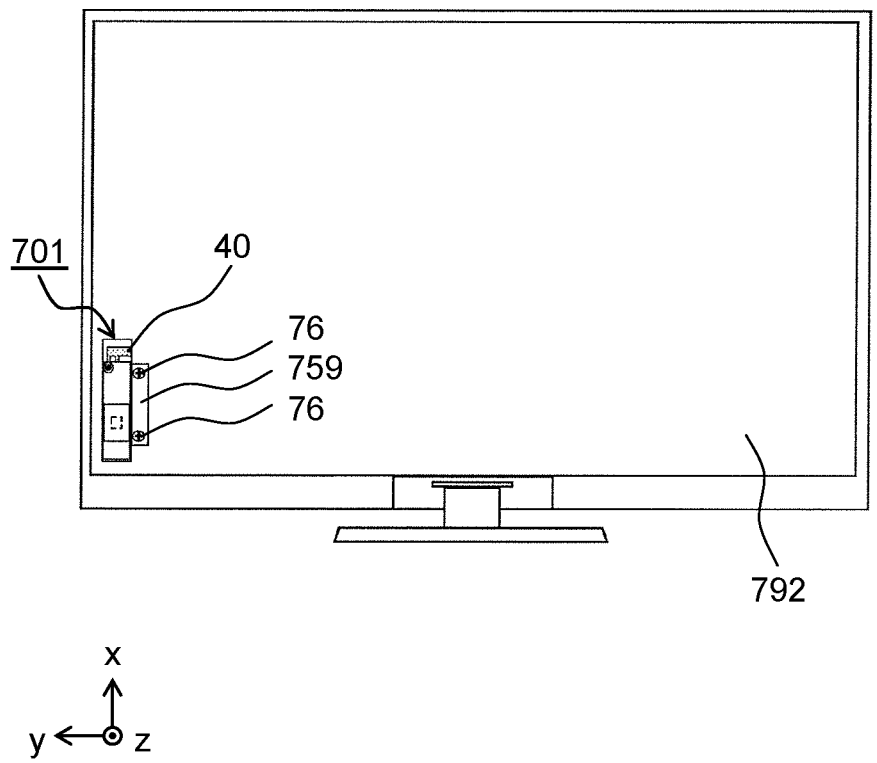
FIG. 15 is a rear view schematically showing an example of an external appearance of an image display device including a wireless module in an eighth exemplary embodiment.

FIG. 15 is a rear view schematically showing an example of an external appearance of image display device 790 including wireless module 701 in the eighth exemplary embodiment.

Figure 16:
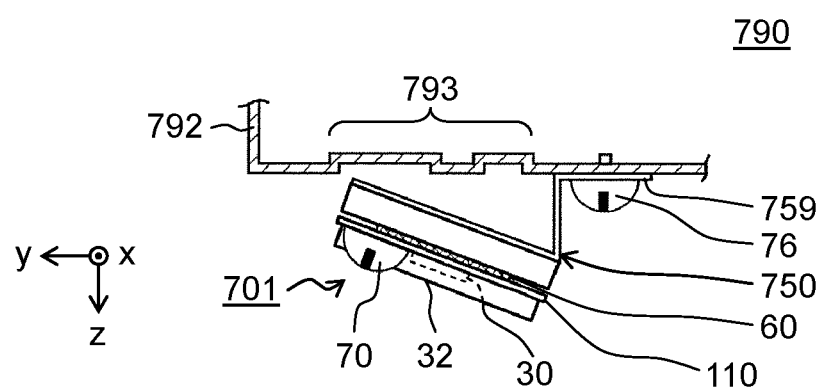
FIG. 16 is an enlarged top view showing a portion to which the wireless module is attached in the image display device of the eighth exemplary embodiment.

FIG. 16 is an enlarged top view showing a portion to which wireless module 701 is attached in image display device 790 of the eighth exemplary embodiment.

Figure 17:
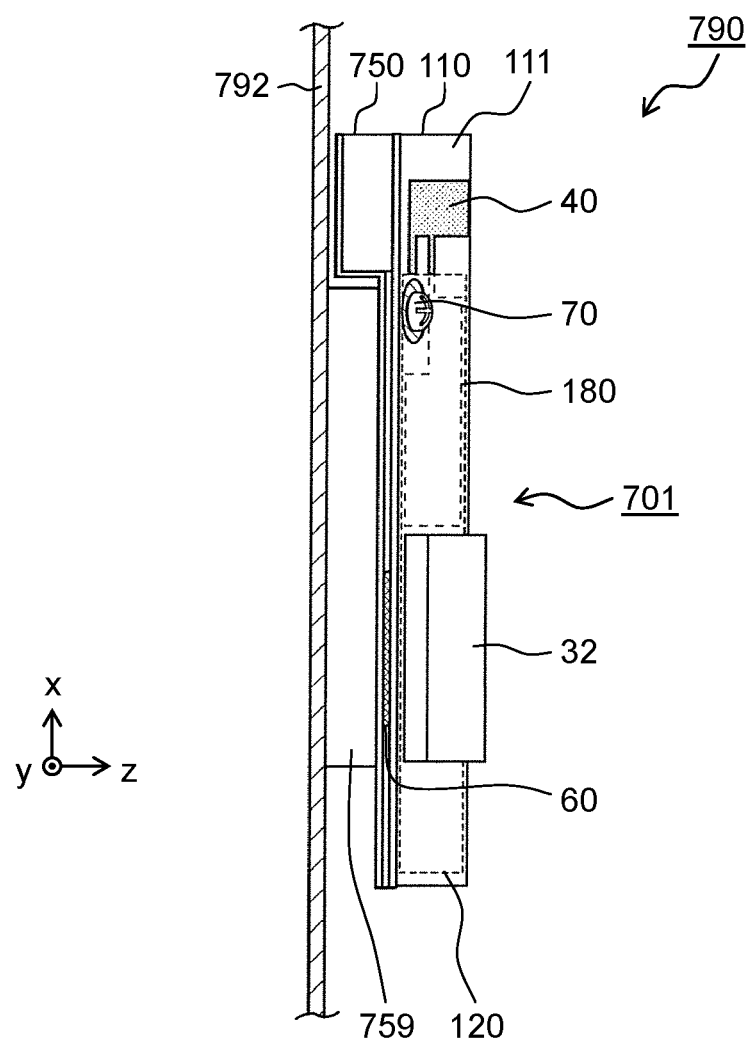
FIG. 17 is an enlarged side view showing the portion to which the wireless module is attached in the image display device of the eighth exemplary embodiment.

FIG. 17 is an enlarged side view showing a portion to which wireless module 701 is attached in image display device 790 of the eighth exemplary embodiment.

Note that FIGS. 16 and 17 show a cross-sectional view of chassis 792 in order to describe a cross-sectional shape of chassis 792 to which wireless module 701 is attached.

Note that, in FIGS. 15 to 17, it is assumed that a direction that is a vertical direction and also a longitudinal direction of wireless module 701 is defined as the x-axis direction, and an upward orientation in the vertical direction is defined as a positive orientation of the x-axis direction. Moreover, it is assumed that a direction perpendicular to the x-axis direction and perpendicular to a front surface of image display device 790 (that is, a surface on which a display screen is disposed) and to a rear surface of image display device 790 (that is, a back surface of the display screen) is defined as the z-axis direction, and a direction perpendicular to the x-axis direction and the z-axis direction is defined as the y-axis direction.

Image display device 790 shown in FIGS. 15 to 17 is, for example, a television receiver. Image display device 790 includes: wireless module 701; and chassis 792 to which wireless module 701 is attached.

As shown in FIG. 15, wireless module 701 is disposed near an end in the y-axis direction of metal chassis 792 disposed on a rear surface side of image display device 790. In this way, wireless module 701 can be disposed at a position that cannot be viewed from a front surface side of image display device 790. Moreover, in this exemplary embodiment, wireless module 701 is disposed near the end of chassis 792, whereby a component in the electromagnetic wave radiated from wireless module 701, the component being diffracted from a rear surface side of image display device 790 to a front surface side of image display device 790 at the end of chassis 792, can be increased. Note that, for example, wireless module 701 may be disposed near an end in the x-axis direction of chassis 792 of image display device 790.

As shown in FIGS. 15 and 16, on base plate 150 shown in the second exemplary embodiment, base plate 750 of wireless module 701 further includes attachment part 759 for attaching wireless module 701 to chassis 792. Two through holes (not shown) are formed in attachment part 759, and screws 76 are individually inserted into the two through holes. Two screws 76 are screwed into two threaded holes (not shown), which are formed in chassis 792, through attachment part 759, whereby base plate 750 is fixed to chassis 792. In this way, wireless module 701 is fixed to chassis 792.

In image display device 790, as shown in FIGS. 16 and 17, pattern antenna 40 of wireless module 701 is disposed so as to be inclined with respect to chassis 792. That is, in wireless module 701, when attachment part 759 is attached to chassis 792, base plate 750 is formed so that pattern antenna 40 (that is, substrate 110) can be inclined with respect to a surface of chassis 792, to which attachment part 759 is attached. In other words, in base plate 750, attachment part 759 is inclined with respect to conducting portion 153 (refer to FIG. 5B).

In this way, in image display device 790, the component in the electromagnetic wave radiated from wireless module 701, the component propagating from the rear surface side of image display device 790 to the front surface side of image display device 790, can be increased.

Note that, in image display device 790, a shape of a portion of chassis 792, to which wireless module 701 is attached, is not necessarily flat, and may have various shapes according to a structure of image display device 790. Specifically, as illustrated in FIG. 16, chassis 792 may have irregularities 793 with various shapes in a portion near wireless module 701. However, in this exemplary embodiment, base plate 750 of wireless module 701 is disposed between chassis 792 and substrate 110 provided with pattern antenna 40. Therefore, metal closest to chassis 792 becomes base plate 750. From this, even when chassis 792 has irregularities 793, an influence of the shapes of irregularities 793 on the radiation characteristics of the electromagnetic wave is suppressed in wireless module 701, and radiation characteristics, which are always stable, can be obtained in the antenna unit.

Note that, in image display device 790 shown in FIG. 15, chassis 792 is exposed on the rear surface, and image display device 790 may include a rear surface cover that covers chassis 792 and wireless module 701. In that case, the rear surface cover has a configuration of transmitting the electromagnetic wave. For example, the rear surface cover is formed of an insulating material.

Note that, in this exemplary embodiment, the television receiver is illustrated as an example of image display device 790 as an object to which wireless module 701 is to be fixed;

however, image display device 790 is not limited to the television receiver. For example, image display device 790 may be a display device for a personal computer, or the like.

Note that, in this exemplary embodiment, it is assumed that wireless module 701 has substantially the same configuration as that of wireless module 101 described in the second exemplary embodiment except that base plate 750 has attachment part 759. However, wireless module 701 described in the eighth exemplary embodiment may be configured to include attachment part 759 in any one of the wireless modules described in the first and third to seventh exemplary embodiments.

[8-2. Effects and Others]

As described above, in this exemplary embodiment, an image display device includes: a wireless module; and a chassis to which the wireless module is attached, wherein a base plate of the wireless module is disposed between the substrate and the chassis.

Note that image display device 790 is an example of the image display device. Wireless module 701 is an example of the wireless module. Chassis 792 is an example of the chassis. Base plate 750 is an example of the base plate. Substrate 110 is an example of the substrate.

For example, in the example shown in the eighth exemplary embodiment, image display device 790 includes: wireless module 701; and chassis 792 to which wireless module 701 is attached, and base plate 750 is disposed between substrate 110 and chassis 792.

Image display device 790 configured as described above can dissipate the heat, which is generated by heat generating component 30, by base plate 750 in wireless module 701. Dimensions and shape of base plate 750 are not limited by the frequency and wavelength of the electromagnetic wave used in wireless module 701. Therefore, it is possible to design base plate 750 with dimensions and a shape, which correspond to the heat radiation characteristics required for wireless module 701. In this way, sufficient heat radiation characteristics can be realized in wireless module 701.

Other Exemplary Embodiments

The first to eighth exemplary embodiments and the modification examples of the first exemplary embodiment have been described above as illustrations of the technique disclosed in the present application. However, the technique in the present disclosure is not limited thereto, and can also be applied to exemplary embodiments subjected to alteration, substitution, addition, omission and the like. Moreover, it is also possible to make new exemplary embodiments by combining, with one another, the constituent elements described above in the first to eighth exemplary embodiments or the modification examples of the first exemplary embodiment.

Therefore, other exemplary embodiments will be described below.

In each of the exemplary embodiments and the modification examples described above, such a configuration example is described, in which, in the wireless module, the pattern antenna is formed on the first main surface side of the substrate. However, the present disclosure is not limited to this configuration example. For example, in the wireless module, the pattern antenna may be formed on the second main surface side of the substrate.

In each of the exemplary embodiments and the modification examples described above, such a configuration example is described, in which, in the wireless module, the pattern antenna is exposed without being covered with the resist. However, the present disclosure is not limited to this configuration example. For example, in the wireless module, the pattern antenna may be covered with the resist. In this configuration, the pattern antenna can be protected by the resist.

In each of the second to eighth exemplary embodiments, such a configuration example is described, in which, in the wireless module, the base plate is fixed to the substrate by using the conductive screw, whereby the conduction between the base plate and the ground pattern on the first main surface side of the substrate is further stabilized. However, the present disclosure is not limited to this configuration example. For example, a non-conductive screw may be used in the wireless module. In the wireless module described in the present disclosure, even if the non-conductive screw is used, the ground pattern on the first main surface side of the substrate can be electrically connected to the base plate via the through holes, the via electrodes, and the like and the ground pattern on the second main surface side.

In each of the exemplary embodiments and the modification examples described above, such a configuration example is described, in which, in the wireless module, the heat conducting member is provided between the heat generating component and the base plate. However, the present disclosure is not limited to this configuration example. In the wireless module, the heat conducting member is not essential. For example, the base plate and the substrate or the shield case may be in direct contact with each other.

In each of the exemplary embodiments and the modification examples described above, such a configuration example is described, in which, in the wireless module, members other than the substrate are not inserted into the gap formed between the base plate and the pattern antenna. That is, in each of the exemplary embodiments and the modification examples described above, such a configuration example is shown, in which the gap is formed between the base plate and the pattern antenna. However, the wireless module according to the present disclosure is not limited to this configuration example. For example, in the wireless module, a dielectric may be inserted into the gap.

The respective exemplary embodiments and the respective modification examples have been described above as the illustrations of the technique disclosed in the present disclosure. For this purpose, the accompanying drawings and the detailed description have been provided.

Hence, the constituent elements described in the accompanying drawings and the detailed description may include not only the constituent elements, which are essential for solving the problem, but also constituent elements, which are not essential for solving the problem, in order to illustrate the technique described above. Therefore, it should not be immediately recognized that such inessential constituent elements are essential by the fact that the inessential constituents are described in the accompanying drawings and the detailed description.

Moreover, the above-mentioned exemplary embodiments are for illustrating the technique in the present disclosure, and accordingly, can be subjected to various types of alterations, substitutions, additions, omissions, and the like within the scope of claims or equivalents of the claims. Moreover, it is also possible to make new exemplary embodiments by combining, with one another, the constituent elements described above in the first to eighth exemplary embodiments and the respective modification examples of the first exemplary embodiment.

INDUSTRIAL APPLICABILITY

The present disclosure is applicable to a wireless communication device and an electrical device having a wireless communication function. Specifically, the present disclosure is applicable to a wireless LAN terminal, a wireless LAN router, a television receiver, a display device for a personal computer, and the like.

REFERENCE MARKS IN THE DRAWINGS 1, 1a, 1b, 1c, 1d, 1e, 1f, 1g, 101, 201, 301, 401, 501, 601, 701: wireless module
10, 110, 210, 310, 510, 610: substrate
11, 111, 211, 311, 511, 611: first main surface
12, 112, 212, 312, 612: second main surface
16: resist
20, 120, 220, 320, 520, 620: ground pattern
30: heat generating component
32: shield case
40, 40a, 40b, 540: pattern antenna
42, 42a, 42b, 542: grounding part
44, 44a, 44b, 544: power feeding part
50, 50a, 50b, 50c, 50d, 50e, 50f, 50g, 150, 250, 350, 450, 650, 750: base plate
51, 51b, 51c, 51d, 51e, 51f, 51g, 151, 251, 351, 451, 651a, 651b: opposed portion
52, 52e, 152, 252, 452, 652a, 652b: gap forming portion
52a: closed portion
53, 153, 253, 453, 653: conducting portion
60, 360: heat conducting member
70, 70a, 70b, 72: conductive screw
76: screw
80, 180, 580, 680a, 680b: matching circuit
113, 213, 214, 313, 613a, 613b: through hole
121, 122, 221, 222, 223, 321, 322, 521, 621a, 621b, 622a, 622b: exposed portion
154, 254, 256, 454, 654a, 654b: protrusion
156, 257, 258, 656a, 656b: threaded hole
255: regulating part
354: truncated cone portion
457: radiation fin
546: first antenna part
548: second antenna part
759: attachment part
790: image display device
792: chassis
793: irregularities

The invention claimed is:

1. A wireless module comprising:
a substrate including a first main surface and a second main surface;
a first ground pattern formed on the first main surface of the substrate and a second ground pattern formed on the second main surface of the substrate;
a heat generating component mounted on the first main surface of the substrate and connected to the first ground pattern;
a pattern antenna including a grounding part connected to the first ground pattern and a power feeding part fed with power from the heat generating component, the pattern antenna being formed on the first main surface of the substrate; and
a base plate electrically connected to the second ground pattern and disposed opposite to the pattern antenna, wherein the base plate is connected to the second ground pattern so as to form a connected portion, the connected portion being located on the second main surface directly opposite the location of the grounding part on the first main surface, or the connected portion being located on the second main surface adjacent the location directly opposite the location of the grounding part on the first main surface,
the base plate having a gap forming portion which forms a gap between the second main surface and a portion of the base plate opposite to the pattern antenna, and a conducting portion which extends from the gap forming portion to an end of the substrate.

2. The wireless module according to claim 1, wherein a distance between the portion of the base plate opposite to the pattern antenna and the pattern antenna is $1/30$ to $1/10$ times the wavelength of electromagnetic wave used in the wireless module.

3. The wireless module according to claim 1, further comprising a fastening member that fastens the substrate and the base plate to each other.

4. The wireless module according to claim 1, further comprising a fastening member that fastens the substrate and the base plate to each other,
wherein the fastening member has conductivity and is in contact with the second ground pattern, and
the base plate is electrically connected to the second ground pattern via the fastening member.

5. The wireless module according to claim 1, further comprising a fastening member that fastens the substrate and the base plate to each other,
wherein the fastening member has conductivity and is in contact with the first ground pattern,
the base plate is electrically connected to the first ground pattern via the fastening member,
the fastening member has a threaded portion,
the base plate is provided with a threaded hole into which the threaded portion is screwed, and
the base plate is electrically connected to the first ground pattern via the threaded portion.

6. The wireless module according to claim 1, wherein
the first ground pattern has a first exposed portion exposed to an outside,
the second ground pattern has a second exposed portion exposed to an outside, and
the base plate is electrically connected to the first ground pattern and the second ground pattern via the first exposed portion and the second exposed portion.

7. The wireless module according to claim 1, wherein
the second ground pattern has exposed portion exposed to an outside,
the base plate has a protrusion at a position corresponding to the exposed portion, and
the base plate is electrically connected to the second ground pattern by contact between the protrusion and the exposed portion.

8. The wireless module according to claim 1, further comprising a heat conducting member which is disposed between the base plate and the heat generating component, and conducts, to the base plate, heat generated by the heat generating component.

9. The wireless module according to claim 1, further comprising a heat conducting member which is disposed between the base plate and the heat generating component, and conducts, to the base plate, heat generated by the heat generating component,
wherein the heat conducting member includes an elastomer as a material for use.

10. The wireless module according to claim 1, wherein the pattern antenna has a shape adaptable for a multi-band.

11. An image display device comprising:
the wireless module according to claim 1; and
a chassis to which the wireless module is attached,
wherein the base plate is disposed between the substrate and the chassis.

* * * * *